US012442081B2

(12) United States Patent
Soininen et al.

(10) Patent No.: US 12,442,081 B2
(45) Date of Patent: Oct. 14, 2025

(54) NOZZLE HEAD AND APPARATUS

(71) Applicant: BENEQ OY, Espoo (FI)

(72) Inventors: Pekka Soininen, Espoo (FI); Mikko Söderlund, Espoo (FI)

(73) Assignee: BENEQ OY, Espoo (FI)

( * ) Notice: Subject to any disclaimer, the term of this patent is extended or adjusted under 35 U.S.C. 154(b) by 499 days.

(21) Appl. No.: 17/047,550

(22) PCT Filed: Apr. 15, 2019

(86) PCT No.: PCT/FI2019/050301
§ 371 (c)(1),
(2) Date: Oct. 14, 2020

(87) PCT Pub. No.: WO2019/202211
PCT Pub. Date: Oct. 24, 2019

(65) Prior Publication Data
US 2021/0115561 A1 Apr. 22, 2021

(30) Foreign Application Priority Data
Apr. 16, 2018 (FI) ..................................... 20185361

(51) Int. Cl.
*C23C 16/455* (2006.01)
*C23C 16/44* (2006.01)

(52) U.S. Cl.
CPC .... *C23C 16/45574* (2013.01); *C23C 16/4408* (2013.01); *C23C 16/45551* (2013.01)

(58) Field of Classification Search
CPC .......... C23C 16/45574; C23C 16/4408; C23C 16/45551; C23C 16/045; C23C 16/45578; C23C 16/545; C23C 16/54
See application file for complete search history.

(56) References Cited

U.S. PATENT DOCUMENTS 8,333,839 B2 * 12/2012 Oh .................... C23C 16/45551 118/724
2009/0291211 A1 11/2009 Ryu et al.
(Continued)

FOREIGN PATENT DOCUMENTS

TW I552199 B * 10/2016
WO 2018002450 A1 1/2018

OTHER PUBLICATIONS

Finnish Search Report issued by the Finnish Patent and Registration Office in relation to Finnish Application No. 20185361 dated Oct. 25, 2018 (2 pages).
(Continued)

*Primary Examiner* — Jeffrie R Lund
(74) *Attorney, Agent, or Firm* — Carter, DeLuca & Farrell LLP

(57) ABSTRACT

A nozzle head and apparatus for subjecting a surface of a substrate to alternate surface reactions of at least two precursors (A, B) includes an output face, at least one gas supply nozzle, and at least one discharge nozzle. The nozzle head includes on the output face in the following order: a first zone end nozzle, a gas supply nozzle and a second zone end nozzle, repeated one or more times. The first zone end nozzle is arranged at a first distance ($L_Y$) from the gas supply nozzle and the second zone end nozzle is arranged at a second distance ($L_X$) from the gas supply nozzle. The second distance ($L_X$) is greater than the first distance ($L_Y$).

10 Claims, 24 Drawing Sheets

(56) References Cited

U.S. PATENT DOCUMENTS

| | | | | |
|---|---|---|---|---|
| 2010/0041213 | A1 | 2/2010 | Lee | |
| 2011/0076421 | A1 | 3/2011 | Lee | |
| 2012/0225204 | A1 * | 9/2012 | Yudovsky | C23C 16/54 427/248.1 |
| 2012/0225207 | A1 * | 9/2012 | Yudovsky | C23C 16/45551 118/724 |
| 2013/0337172 | A1 | 12/2013 | Lee | |
| 2014/0366804 | A1 | 12/2014 | Pak et al. | |
| 2017/0159179 | A1 * | 6/2017 | Soininen | C23C 16/45574 |
| 2021/0115561 | A1 * | 4/2021 | Soininen | C23C 16/45551 |
| 2021/0214847 | A1 * | 7/2021 | Soininen | C23C 16/54 |

OTHER PUBLICATIONS

International Search Report issued by the Finnish Patent and Registration Office acting as the International Searching Authority in relation to International Application No. PCT/FI2019/050301 dated Jun. 26, 2019 (5 pages).

Written Opinion of the International Searching Authority issued by the Finnish Patent and Registration Office acting as the International Searching Authority in relation to International Application No. PCT/FI2019/050301 dated Jun. 26, 2019 (8 pages).

* cited by examiner

NOZZLE HEAD AND APPARATUS

CROSS-REFERENCE TO RELATED APPLICATIONS

This application is a national phase entry under 35 U.S.C. 371 of PCT International Application No. PCT/FI2019/050301 filed Apr. 15, 2019, which claims priority to Finnish Patent Application No. 20185361, filed Apr. 16, 2018, the disclosure of each of these applications is expressly incorporated herein by reference in their entirety.

FIELD OF THE INVENTION

The present invention relates to a nozzle head and apparatus for subjecting a surface of a substrate to alternate surface reactions of at least two precursors according to principles of atomic layer deposition and more particularly to a nozzle head and apparatus.

BACKGROUND OF THE INVENTION

When surface of a substrate is coated using atomic layer deposition (ALD) the object is normally to provide a uniform coating layer over the whole surface of the substrate. Usually, the surface of the substrate comprises rather deep pores or pinholes extending from the surface of the substrate into the substrate. In order to make the coating layer on the surface of the substrate uniform, the precursor material have to reach the bottom of the pore or pinhole such that the coating layer is formed also to the inner surface of the pore or pinhole. Similarly, purge has to reach the bottom of the pore or pinhole In spatial ALD great amounts of precursors and/or purge gas have to be supplied to surface of a substrate to be coated for ensuring that the precursors and the purge gas will reach the bottom of the pores and pinholes. Another requirement is that precursors and/or purge gas have to be supplied to or the surface have to be subjected to the precursor and/or purge gas for an adequate time.

One of the problems associated with the prior art spatial ALD is, that the amount of precursor required for achieving uniform coating such that the precursor reach the bottom of the pores and pinholes is so great that a lot of precursor is discharged from the surface of the substrate. This means that a lot of precursor is wasted and not use for forming the coating. Discharged precursors decrease the material efficiency of the spatial ALD. Further, reaction space between the surface of substrate and a nozzle head may be increased when great amounts of precursor or purge gas are supplied from the nozzle head. However, increasing the volume of the reaction space decreases the concentration of the precursor and purge gas in the reaction space. Thus, diffusion of the precursor or the purge gas into the pores or pinholes will slow down preventing the precursors or the purge gas to reach the bottom of the pores or pinholes. Accordingly, achieving uniform coating of the substrate also in the pores and pinholes may be compromised.

BRIEF DESCRIPTION OF THE INVENTION

An object of the present invention is to provide a nozzle head, apparatus and method so as to solve or at least alleviate prior art disadvantages.

The objects of the invention are achieved by a nozzle head which is characterized by what is described herein. The objects of the present invention are also achieved by an apparatus which is characterized by what is stated in the independent claim 9. The objects of the present invention are further achieved by a method which is characterized by what is described herein.

The preferred embodiments of the invention are disclosed in the dependent claims.

The invention is based on the idea of providing a nozzle head for subjecting a surface of a substrate to alternate surface reactions of at least two precursors according to principles of atomic layer deposition. The nozzle head comprises an output face via which gas is supplied towards the surface of the substrate and discharged from the surface of the substrate. The nozzle head further comprises on the output face at least one gas supply nozzle arranged to supply gas towards the surface of the substrate and at least one discharge nozzle arranged to discharge gas from the surface of the substrate via the output face. The nozzle head comprises on the output face in the following order: a first zone end nozzle, a gas supply nozzle and a second zone end nozzle, repeated one or more times on the output face. The first zone end nozzle is a discharge nozzle or purge gas nozzle arranged to discharge gas from the surface of the substrate or supply purge gas towards the surface of the substrate, respectively. The second zone end nozzle is a discharge nozzle arranged to discharge gas from the surface of the substrate. The gas supply nozzle is precursor nozzle arranged to supply precursor gas towards the surface of the substrate. Further, the first zone end nozzle is arranged at a first distance from the gas supply nozzle and the second zone end nozzle is arranged at a second distance from the gas supply nozzle. The second distance is at least 1.5 times greater than the first distance. Accordingly, the second zone end nozzle is arranged at least 1.5 times further from the gas supply nozzle than the first zone end nozzle.

This enables increasing the residence time of the precursor or purge gas in the reaction space in the flow direction towards the second zone end nozzle. The increased residence time enables the precursor or the purge gas to reach the bottom of the pores or pinholes.

It should be noted that in the context of this application the mentioned order means that the order of the nozzles is exact such that no additional nozzles are between the nozzles as defined in the order.

In one embodiment of the present invention, the nozzle head comprises at least one precursor zone provided between the first zone end nozzle and the second zone end nozzle such that the gas supply nozzle is a precursor nozzle arranged to supply precursor towards the surface of the substrate. This embodiment may enable providing an asymmetric precursor zone in which the precursor flows from the precursor nozzle along the output face of the nozzle head a longer distance in the direction of the second zone end nozzle than in the direction towards the first zone end nozzle.

In an alternative embodiment, the nozzle head comprises at least one first precursor zone provided between the first zone end nozzle and the second zone end nozzle such that the gas supply nozzle is a first precursor nozzle arranged to supply a first precursor towards the surface of the substrate, and at least one second precursor zone provided between the first zone end nozzle and the second zone end nozzle such that the gas supply nozzle is a second precursor nozzle arranged to supply a second precursor towards the surface of the substrate. This embodiment may enable providing asymmetric first and second precursor zones in which the precursors flow from the first and second precursor nozzles, respectively, along the output face of the nozzle head a longer distance in the direction of the second zone end nozzle than in the direction towards the first zone end nozzle.

In one embodiment of the present invention, the nozzle head comprises at least one purge gas zone provided between the first zone end nozzle and the second zone end nozzle such that the gas supply nozzle is a purge gas nozzle arranged to supply purge gas towards the surface of the substrate. This embodiment may enable providing an asymmetric purge gas zone in which the purge gas flows from the purge gas nozzle along the output face of the nozzle head a longer distance in the direction of the second zone end nozzle than in the direction towards the first zone end nozzle.

In an alternative embodiment, the nozzle head comprises at least one first precursor zone provided between the first zone end nozzle and the second zone end nozzle such that the gas supply nozzle is a first precursor nozzle arranged to supply a first precursor towards the surface of the substrate, at least one second precursor zone provided between the first zone end nozzle and the second zone end nozzle such that the gas supply nozzle is a second precursor nozzle arranged to supply a second precursor towards the surface of the substrate, and at least one purge gas zone provided between the first zone end nozzle and the second zone end nozzle such that the gas supply nozzle is a purge gas nozzle arranged to supply purge gas towards the surface of the substrate. This embodiment may enable providing asymmetric first and second precursor zones and an asymmetric purge gas zone in which the precursors and the purge gas flow from the first and second precursor nozzles and purge gas nozzle, respectively, along the output face of the nozzle head a longer distance in the direction of the second zone end nozzle than in the direction towards the first zone end nozzle.

The first zone end nozzle is a discharge nozzle and the gas supply nozzle is provided between two discharge nozzles.

In another embodiment, the first zone end nozzle is a discharge nozzle and the gas supply nozzle is a purge gas nozzle arranged to supply purge gas towards the surface of the substrate via the output face. In this embodiment, purge gas may be supplied between two discharge nozzles such that the purge gas flows from the purge gas nozzle along the output face of the nozzle head a longer distance in the direction of the second zone end nozzle than in the direction towards the first zone end nozzle.

In yet another embodiment, the first zone end nozzle is a discharge nozzle and the gas supply nozzle is a precursor nozzle arranged to supply precursor towards the surface of the substrate via the output face. In this embodiment, precursor may be supplied between two discharge nozzle such that the precursor flows from the precursor nozzle along the output face of the nozzle head a longer distance in the direction of the second zone end nozzle than in the direction towards the first zone end nozzle.

In one embodiment, the nozzle head comprises on the output face in the following order: a purge gas nozzle, a discharge nozzle, a gas supply nozzle and a discharge nozzle, repeated one or more times on the output face. In this embodiment, the discharge nozzle, meaning the first zone end nozzle, is provided between the purge gas nozzle and the gas supply nozzle.

In an alternative embodiment, the nozzle head comprises on the output face in the following order: a purge gas nozzle, a discharge nozzle, a gas supply nozzle, a discharge nozzle and a purge gas nozzle, repeated one or more times on the output face. In this embodiment, the discharge nozzle, meaning the second zone end nozzle, may be provided between the gas supply nozzle and the purge gas nozzle.

In a yet alternative embodiment, the nozzle head comprises on the output face in the following order: a purge gas nozzle, a discharge nozzle, a gas supply nozzle, a discharge nozzle, a purge gas nozzle and a discharge nozzle, repeated one or more times on the output face.

In one embodiment, the first zone end nozzle is a purge gas nozzle arranged to supply purge gas towards the surface of the substrate via the output face. In this embodiment, the gas supply nozzle may be provided between the purge gas nozzle and the discharge nozzle. This may enable the gas supplied from the gas supply nozzle to flow only in one direction towards the discharge nozzle, meaning the second zone end nozzle. The purge gas or at least part of the purge gas supplied from the purge gas nozzle, meaning the first zone end nozzle, also flows partly towards the gas supply nozzle and the discharge nozzle.

In another embodiment, the first zone end nozzle is a purge gas nozzle arranged to supply purge gas towards the surface of the substrate via the output face and the gas supply nozzle may be a precursor nozzle arranged to supply precursor towards the surface of the substrate via the output face. In this embodiment, precursor may be supplied from the precursor nozzle and arranged to flow only in one direction towards the discharge nozzle, meaning the second zone end nozzle. The purge gas or at least part of the purge gas supplied from the purge gas nozzle, meaning the first zone end nozzle, also flows partly towards the precursor nozzle and the discharge nozzle.

In one embodiment, the nozzle head may comprise on the output face in the following order: a discharge nozzle, a purge gas nozzle, a gas supply nozzle and a discharge nozzle, repeated one or more times on the output face. In this embodiment, the purge gas nozzle, meaning the first zone end nozzle, may be arranged between the discharge nozzle and the gas supply nozzle.

In another embodiment, the nozzle head may comprise on the output face in the following order: a discharge nozzle, a purge gas nozzle, a gas supply nozzle a discharge nozzle and a purge gas nozzle, repeated one or more times on the output face. In this embodiment, the discharge nozzle, meaning the second zone end nozzle, may be arranged between the gas supply nozzle and the purge gas nozzle.

In a yet alternative embodiment, the nozzle head may comprise on the output face in the following order: a discharge nozzle, a purge gas nozzle, a gas supply nozzle, the discharge nozzle and a purge gas nozzle and a discharge nozzle, repeated one or more times on the output face.

In one embodiment of the present invention, the output face may comprise a first end and a second end. The first zone end nozzle, the gas supply nozzle and the second zone end nozzle may be arranged on the output face between the first end and the second end.

In another embodiment, the first zone end nozzle, the gas supply nozzle and the second zone end nozzle may be longitudinal nozzles arranged on the output face adjacent to each other and arranged on the output face between the first end and the second end in the mentioned order.

In a yet alternative embodiment, the first zone end nozzle, the gas supply nozzle and the second zone end nozzle may be longitudinal nozzles arranged on the output face adjacent to each other in a direction between the first end and the second end and arranged on the output face between the first end and the second end in the mentioned order. In this embodiment, the longitudinal nozzles are arranged adjacent to each other and successively between the first end and the second end of the output face in the mentioned order. Thus, the surface of the substrate may be subjected successively to the adjacent nozzles in the direction between the first end and the second end.

In one embodiment, the second distance is at least 2 times the first distance, or at least 3 times the first distance. In another embodiment, the second distance may be 2-10 times the first distance. This enables the gas supplied from the gas supply nozzle to flow considerably longer distance towards the second zone end nozzle than towards the first zone end nozzle.

The invention is based on the idea of providing an apparatus for subjecting a surface of a substrate to alternate surface reactions of at least two precursors according to principles of atomic layer deposition. The apparatus comprises a nozzle head having an output face via which the gases are supplied towards the surface of the substrate, and a transport mechanism arranged to transport the substrate in a transport direction relative to the nozzle head for subjecting the surface of the substrate to alternate surface reactions of the at least two precursors.

The nozzle head comprises on the output face at least one gas zone comprising a gas supply nozzle arranged to supply gas towards the surface of the substrate via the output face. The at least one gas zone extends in the transport direction a first distance from the gas supply nozzle to an adjacent first zone end nozzle, and the at least one gas zone extends in a direction opposite the transport direction a second distance from the gas supply nozzle to an adjacent second zone end nozzle. The first zone end nozzle, the gas supply nozzle and the second zone end nozzle are longitudinal nozzles extending on the output face in a direction perpendicular or transversely to the transport direction. The second distance in the direction opposite the transport direction is greater than the first distance in the transport direction. Accordingly, the gas zone extends from the gas supply nozzle a greater distance on the output face in the direction opposite the transport direction of the substrate than in the transport direction. This enables utilizing counter flow for subjecting the surface of the substrate to gases and also an extended exposure time of the surface of the substrate to gases.

In one embodiment, the nozzle head of the apparatus comprises on the output face in the direction opposite the transport direction in the following order: the first zone end nozzle, the gas supply nozzle and the second zone end nozzle, repeated one or more times on the output face. In this embodiment, the surface of the substrate may be subjected or may meet nozzles in the following order: the second zone end nozzle, the gas supply nozzle and the first zone end nozzle.

In another embodiment, the first zone end nozzle is arranged at the first distance from the gas supply nozzle in the transport direction and the second zone end nozzle is arranged at the second distance from the gas supply nozzle in the direction opposite the transport direction, the second distance being greater than the first distance. Accordingly, the gas zone is longer from the gas supply nozzle in the direction opposite transport direction of the substrate than from the gas supply nozzle in the transport direction.

In one embodiment, the first zone end nozzle is a discharge nozzle arranged to provide gas flow in the transport direction from the gas supply nozzle towards the first zone end nozzle. Thus, the gas supplied from the gas supply nozzle may flow in the transport direction of the substrate from the gas supply nozzle to the discharge nozzle, meaning. the first zone end nozzle.

In another embodiment, the first zone end nozzle is a discharge nozzle arranged to provide a first gas flow in the transport direction from the gas supply nozzle towards the first zone end nozzle, and the second zone end nozzle may be a discharge nozzle arranged to provide a second gas flow in the direction opposite the transport direction from the gas supply nozzle towards the second zone end nozzle. Accordingly, the gas supplied from the gas supply nozzle may flow in the gas zone in both the first and second flow direction, meaning the transport direction and the direction opposite the transport direction, from the gas supply nozzle.

In a yet other embodiment, the second zone end nozzle is a discharge nozzle arranged to provide a second gas flow in the direction opposite the transport direction from the gas supply nozzle towards the second zone end nozzle and the first zone end nozzle may be a purge gas nozzle arranged to provide a second gas flow in the direction opposite the transport direction from the gas supply nozzle towards the second zone end nozzle. Accordingly, in this embodiment the gas supplied form the gas supply nozzle may flow only in the direction opposite the transport direction as the purge gas from the first zone end nozzle prevents the gas from the gas supply nozzle from flowing in the transport direction and forces the gas from the gas supply nozzle to flow in the direction opposite the transport direction towards the second zone end nozzle.

In one embodiment, the nozzle head may comprise:

at least one first precursor zone comprising a first precursor nozzle arranged to supply first precursor towards the surface of the substrate via the output face, the at least one first precursor zone extending in the transport direction the first distance from the first precursor nozzle to the first zone end nozzle and the second distance from the first precursor nozzle to the second zone end nozzle; and at least one second precursor zone comprising a second precursor nozzle arranged to supply second precursor towards the surface of the substrate via the output face, the at least one second precursor zone extending in the transport direction the first distance from the second precursor nozzle to the first zone end nozzle and the second distance from the second precursor nozzle to the second zone end nozzle.

The embodiment above, comprises two different precursor zones arranged in similar manner for subjecting the surface of the substrate to two different precursors.

In another embodiment, the nozzle head may comprise:

at least one first precursor zone comprising a first precursor nozzle arranged to supply first precursor towards the surface of the substrate via the output face, the at least one first precursor zone extending in the transport direction the first distance from the first precursor nozzle to the first zone end nozzle and the second distance from the first precursor nozzle to the second zone end nozzle;

at least one second precursor zone comprising a second precursor nozzle arranged to supply second precursor towards the surface of the substrate via the output face, the at least one second precursor zone extending in the transport direction the first distance from the second precursor nozzle to the first zone end nozzle and the second distance from the second precursor nozzle to the second zone end nozzle; and at least one purge gas zone comprising a purge nozzle arranged to supply purge gas towards the surface of the substrate via the output face, the at least one purge gas zone extending in the transport direction the first distance from the purge gas nozzle to the first zone end nozzle and the second distance from the purge gas nozzle to the second zone end nozzle.

The embodiment above, comprises two different precursor zones and a purge gas zone arranged in similar manner for subjecting the surface of the substrate to two different precursors and the purge gas.

In a yet other embodiment, the nozzle head may comprise:

at least one first precursor zone comprising a first precursor nozzle arranged to supply first precursor towards the surface of the substrate via the output face, the at least one first precursor zone extending in the transport direction the first distance from the first precursor nozzle to the first zone end nozzle and the second distance from the first precursor nozzle to the second zone end nozzle; and at least one purge gas zone comprising a purge nozzle arranged to supply purge gas towards the surface of the substrate via the output face, the at least one purge gas zone extending in the transport direction the first distance from the purge gas nozzle to the first zone end nozzle and the second distance from the purge gas nozzle to the second zone end nozzle.

The embodiment above, comprises one precursor zone and a purge gas zone arranged in similar manner for subjecting the surface of the substrate to the first precursor and the purge gas different precursors.

The first zone end nozzle, the gas supply nozzle and the second zone end nozzle are longitudinal nozzles extending on the output face in a direction perpendicular or transversely to the transport direction and are arranged on the output face adjacent to each other in a direction parallel to the transport direction. Accordingly, the nozzles are arranged adjacent to each other and successively in the transport direction or in the direction parallel to the transport direction such that the substrate may meet the nozzles successively.

In one embodiment, the apparatus further comprises a moving mechanism arranged to move the nozzle head relative to the substrate or the transport mechanism in the direction opposite to the transport direction. Accordingly, the also the nozzle head may be moved the direction opposite to the transport direction, and maybe also in the transport direction, for subjecting the surface of the substrate to gases in the gas zones.

The present invention further provides a method for subjecting a surface of a substrate to alternate surface reactions of at least two precursors according to principles of atomic layer deposition by utilizing a nozzle head having an output face via which at least one precursor is supplied on the surface of the substrate. The method comprises forming a reaction space between the output face of the nozzle head and the surface of the substrate, transporting the substrate in a transport direction relative to the nozzle head, and supplying at least one gas to the reaction space from the nozzle head via the output face.

The method is carried out with the nozzle head or apparatus of the present invention, as disclosed above.

According to the present invention, the method further comprises supplying the at least one gas into the reaction space such that the at least one gas flows in the reaction space along the output face of the nozzle head a longer distance in a direction opposite the transport direction than in the transport direction. This enables providing an efficient counter flow in the reaction space.

In one embodiment, the method may further comprise supplying the at least one gas into the reaction space such that the at least one gas flows in the reaction space along the output face of the nozzle head a first distance in the transport direction and a second distance in the direction opposite the transport direction, the second distance being greater than the first distance. Accordingly, the gas flow along the second distance provides a counter flow component in relation to the transport direction of the substrate. Similarly, the gas flow along the first distance provides a down flow component in the transport direction of the substrate.

In another embodiment, the method may further comprise supplying the gas into the reaction space such that the gas flows in the reaction space along the output face of the nozzle head only in direction which is opposite to the transport direction. This embodiment enables a counter flow of the gas in the reaction space such that that gas flows only in the counter flow direction, meaning opposite direction, in relation to the transport direction of the substrate.

In one embodiment, the nozzle head may comprise on the output face in the direction opposite to the transport direction arranged in the following order: a purge gas nozzle, a precursor nozzle and a discharge nozzle, repeated one or more times on the output face of the nozzle head, and that the method may comprise supplying purge gas into the reaction space via the purge gas nozzle, supplying precursor into the reaction space via the precursor nozzle and discharging the precursor and the purge gas from the reaction space via the discharge nozzle such that the precursor flows in the reaction space only in the direction opposite to the transport direction.

The above embodiment enables providing the precursor flow in the reaction space as counter flow in relation to the transport direction of the substrate.

In another embodiment, the nozzle head may comprise on the output face in the direction opposite to the transport direction arranged in the following order: a first discharge nozzle, a precursor nozzle or a purge gas nozzle, and a second discharge nozzle, repeated one or more times on the output face of the nozzle head, the discharge nozzle being arranged at a first distance from the precursor nozzle or the from the purge gas nozzle, and the second discharge nozzle being arranged at a second distance from the precursor nozzle or the from the purge gas nozzle, the second distance being greater than the first distance, and that the method may comprise supplying precursor or purge gas into the reaction space via the precursor nozzle or the purge gas nozzle, respectively, discharging the precursor or the purge gas from the reaction space via first discharge gas nozzle and the second discharge nozzle such that the precursor flows in the reaction space along the output face of the nozzle head the first distance in the transport direction and the second distance in the direction opposite the transport direction.

The above embodiment enables providing the precursor flow in the reaction space as counter flow in relation to the transport direction of the substrate along the second distance and as down flow in the direction of the transport direction of the substrate along the first distance.

An advantage of the invention is that the asymmetric gas flow from the gas supply nozzle may provide an extended counter flow component for the gases in the reaction space between the nozzle head and the surface of the substrate. The extended counter flow component enables the gases, precursor gas or purge gas to enter the pore or pinhole in the surface of the substrate and reach the bottom of the pore or pinhole. This due to two factors. First, the extended counter flow component increases time the surface of the substrate is subjected to the gas such that the gas may reach the bottom of the pore or pinhole. Secondly, the extended counter flow component provides an increasing gas concentration in the transport direction of the substrate. This due to the fact the surface of the substrate first meets the second zone end nozzle and only then the gas supply nozzle. The gas or precursor supplied form the gas supply nozzle has already reacted with the surface of the substrate before it flows into the discharge nozzle and out of the reaction space. Thus, the amount of gas or precursor in the reaction space decreases towards the second zone end nozzle and in the direction opposite the transport direction of the substrate. Thus, the upper parts or upper walls of the pores and pinholes become subjected to gas or precursor. As the surface reactions of ALD are saturated surface reactions the precursor does not react again with same surface locations thus precursor may reach deeper parts and the bottom of the pore or pinhole. The increasing concentration or partial vapour pressure of the gas enhances the gas reaching to the bottom of the pores and pinholes. Therefore, a uniform coating may be provided to whole surface of the substrate.

BRIEF DESCRIPTION OF THE DRAWINGS

The invention is described in detail by means of specific embodiments with reference to the enclosed drawings, in which.

DETAILED DESCRIPTION OF THE INVENTION

Figure 1A:
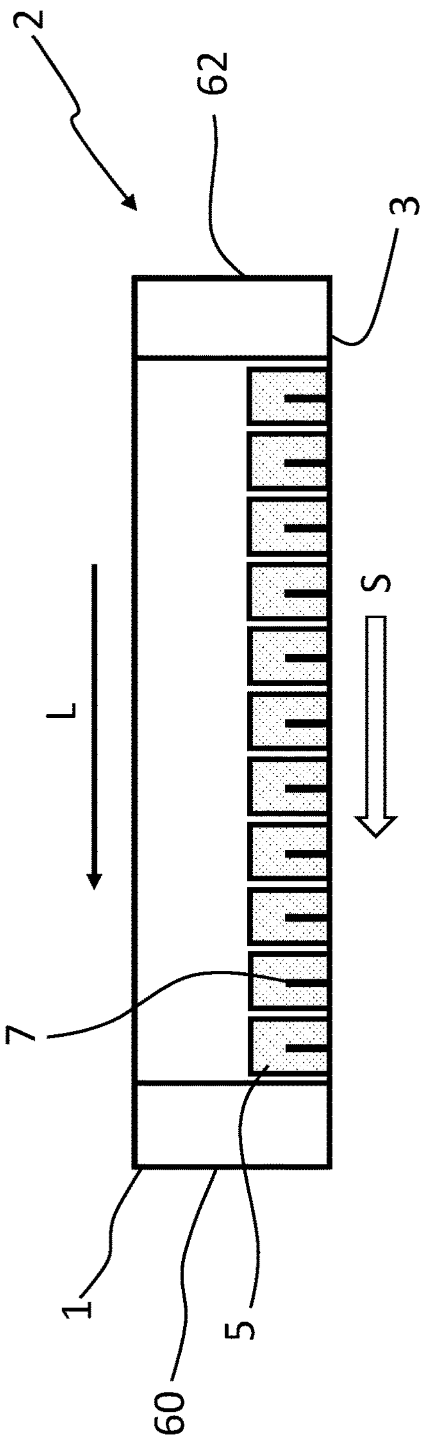
FIGS. 1*a* and 1*b* show one embodiment of a nozzle head.

FIG. 1*a* shows a side view of one embodiment of a nozzle head 2. The nozzle head comprises a body 1 and an output face 3 via which gases are supplied towards the surface of the substrate and discharged from the surface of the substrate. The nozzle head 2 further comprises plurality of nozzle 5. Each nozzle 5 has a nozzle opening 7 open to the output face 3 for supplying gas or discharging gas via the output face 3. The nozzle head 2 or the output face 3 has a first end 60 and second end 62 and length L extending in the direction between the first end 60 and the second end 62. A substrate may be arranged under or in front of the output face 3 such that the gases supplied from the nozzles 5 subject the surface of the substrate to surface reactions. Usually, the substrate may be transported in a transport direction S in relation to the nozzle head 2. The length L of the nozzle head 2 may extend in the transport direction S of the substrate.

Figure 1B:
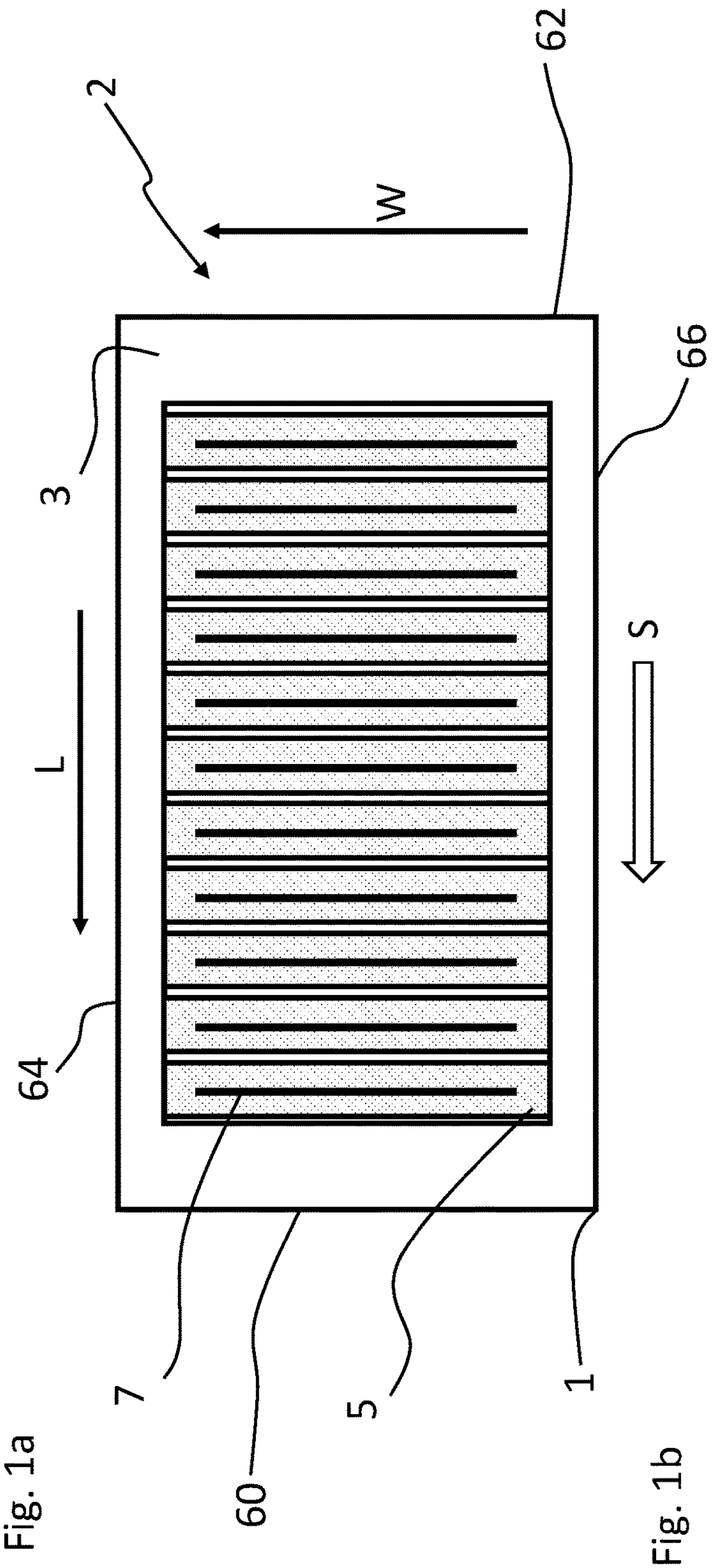

The nozzle head 2 and the output face 3 further have a first side edge 64 and a second side edge 64, as shown in FIG. 1*b*. The nozzle head 2 or the output face 3 has a width W extending between the first side edge 64 and the second side edge 66.

The first and second side edges 64, 66 may extend parallel or substantially parallel to the transport direction S of the substrate. Additionally or alternatively, the first and second end 60, 62 may extend transversely or perpendicularly to the transport direction S of the substrate.

The nozzles 5 are preferably arranged adjacent to each other and successively in the transport direction S of the substrate. They could also be arranged adjacent to each other and successively between the first and second end 60, 62 of the nozzle head 2 or the output face 3. The nozzle 5 and the nozzle openings 7 may be longitudinal nozzles or nozzle openings, as shown in FIG. 1*b*. The longitudinal nozzles 5 or the nozzle openings 7 may extend transversely or perpendicularly to the transport direction S of the substrate. This the nozzles 5 may be arranged successively in the transport direction S.

In one embodiment, as shown in FIGS. 1*a* and 1B, the nozzles 5 and the nozzle openings 5 extend parallel or substantially parallel to the first and second end 60, 62 of the nozzle head 2 of the output face 3. Furthermore, the nozzles 5 and the nozzle openings 5 extend transversely or perpendicularly to the first and second side edges 64, 66 of the nozzle head 2 or the output face 3.

The nozzle 5 may be arranged to supply purge gas or precursor gas towards the surface of the substrate and/or discharge precursor gas and/or purge gas from the surface of the substrate. Thus, the nozzles 5 may comprise gas supply nozzles, for example precursor nozzles or purge gas nozzles, and discharge nozzles.

Accordingly, the nozzle head 2 may comprise at least one gas supply nozzle 5 arranged to supply gas towards the surface of the substrate via the output face 3 and at least one discharge nozzle 5 arranged to discharge gas from the surface of the substrate via the output face 3. The gas supply nozzle may be precursor nozzle arranged to supply precursor gas towards the surface of the substrate via the output face 3, or a purge gas nozzle arranged to supply purge gas towards the surface of the substrate via the output face 3.

It should be noted, that in the figures the substrate is shown as a planar or substantially planar substrate. However, the substrate also be any other kind of substrate such as porous, fibrous, substrate with three dimensional shapes, brush- or grass-like substrate. Furthermore, the substrate may comprise or be pulverized material, particles, material with holes or cavities, separate objects or the like. The present invention or apparatus or nozzle head are especially suitable for porous substrate or substrates with cavities or pinholes, meaning substrates with high surfaces area. The actual substrate or substrate material, as mentioned above, may also be placed or attached to a carried. The carried itself may be a mat, web, plate or any other suitable carrier on the which the substrate(s) maybe provided.

In the embodiment of FIGS. 1*a* and 1*b*, the output face 3 is planar and straight.

Figure 2A:
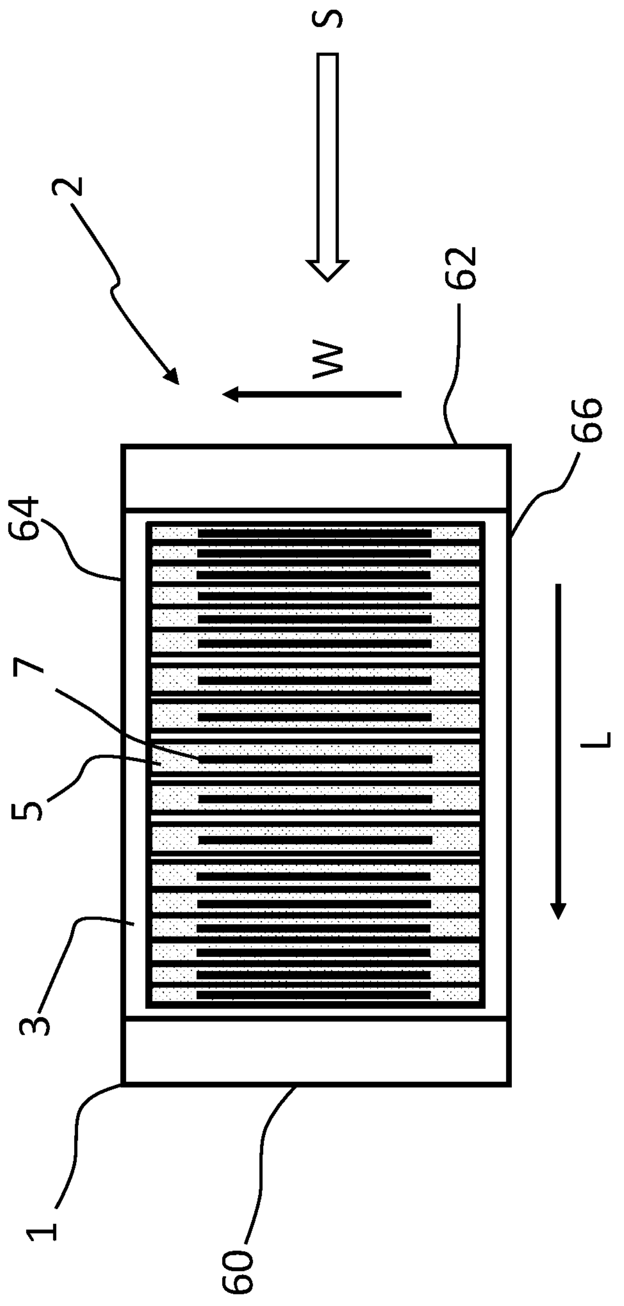
FIGS. 2*a* and 2*b* show another embodiment of a nozzle head.
Figure 2B:
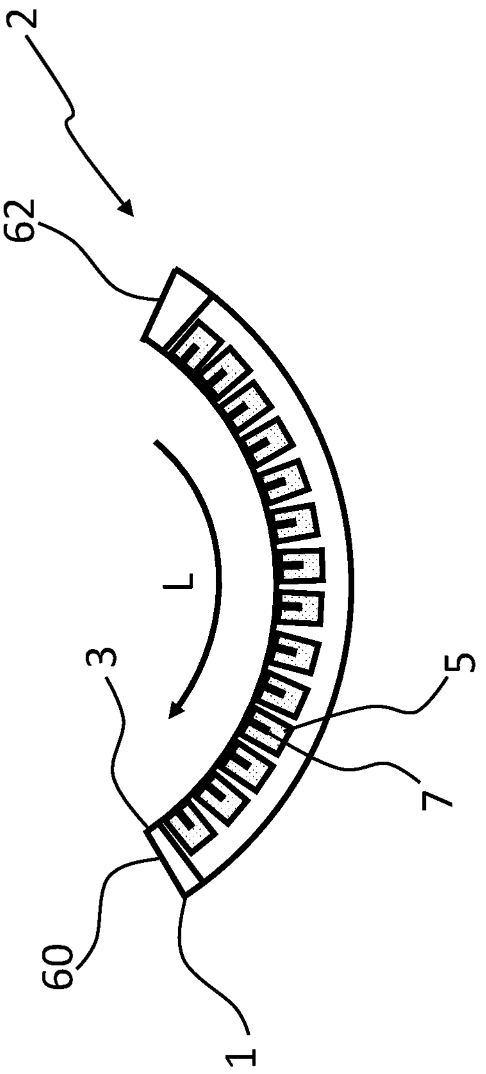

FIGS. 2*a* and 2*b* show an alternative embodiment in which output face 3 of the nozzle head 2 is curved. The output face 3 has the length L along the curved output face 3. The output face 3 may have a fixed radius of curvature or it may be curved in another manner.

It should be noted, that the nozzle head 2 and output face 3 may be provided in any manner and in any configuration without deviating from the present invention. Thus, the present invention is not restricted to any specific configuration or shape of the output face 3 or the nozzles 5.

Figure 3:
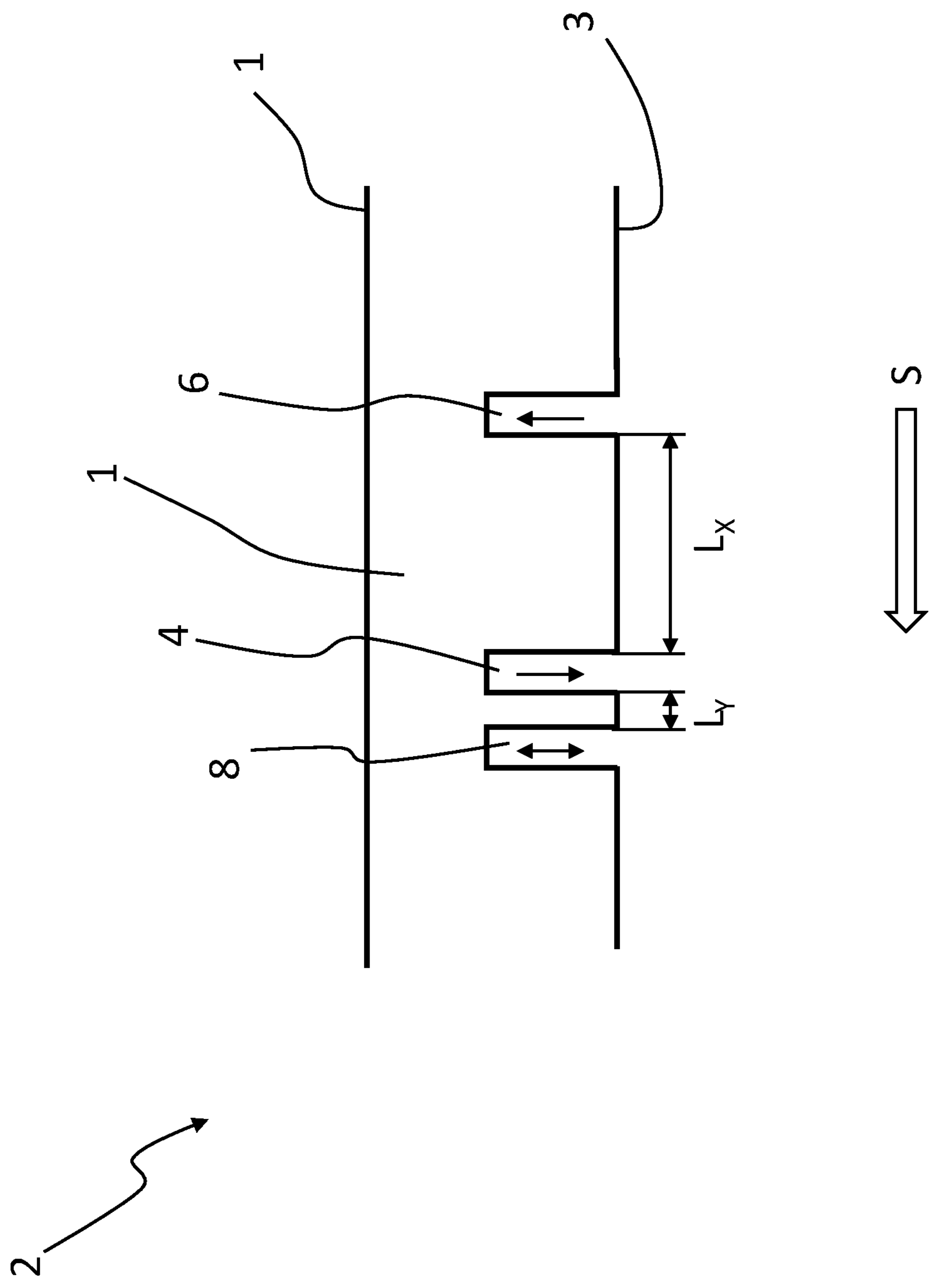
FIGS. 3, 4, 5, 6, 7, 8, 9, 10, 11, 12, 13, 14, 15, 16, 17, 18, 19, 20, 21 and 22 show different embodiments of a nozzle according to the present invention.

FIG. 3 shows a schematic view of a nozzle head 2, or part of the nozzle head 2, according to the present invention. The nozzle head 2 comprises the output face 3 via which gas or gases are supplied towards the surface of the substrate and discharged from the surface or the substrate. The nozzle head 2 comprises on the output face 3 in the following order: a first zone end nozzle 8, a gas supply nozzle 4 and a second zone end nozzle 6. This nozzle configuration may be repeated one or more times on the output face 3.

A gas zone is provided and formed between the first zone end nozzle 8 and the second zone end nozzle 6.

The first zone end nozzle 8 may be a gas supply nozzle or a discharge nozzle. The first zone end nozzle 8 may be a purge gas nozzle. The second zone end nozzle 6 is a discharge nozzle. The gas supply nozzle 4 may be purge gas nozzle or a precursor nozzle.

As shown in FIG. 3, the first zone end nozzle 8 is arranged at a first distance $L_Y$ from the gas supply nozzle 4 and the second zone end nozzle 6 is arranged at a second distance $L_X$ from the gas supply nozzle 4. The second distance $L_X$ is greater than the first distance $L_Y$ such that the first zone end nozzle 8 is closer to the gas supply nozzle 4 than the second zone end nozzle 6.

Accordingly, the gas zone between the first and second zone end is biased towards the second zone end nozzle 8. Thus, the gas zone has a greater dimension from the gas supply nozzle 4 towards the second zone end nozzle 6 than from the gas supply nozzle 4 towards the first zone end nozzle 8.

In preferred embodiment, the nozzle configuration is provided such that the nozzle 8, 4, 6 arranged the output face 3 in the order: a first zone end nozzle 8, a gas supply nozzle 4 and a second zone end nozzle 6 in a direction opposite transport direction S of the substrate, as shown in FIG. 3. This means that the gas zone extends from the gas supply nozzle 4 a longer distance $L_X$ in the direction opposite the transport direction than in the transport direction S.

In one embodiment, the second distance $L_X$ is at least 1.5 times the first distance $L_Y$, or at least 2 times the first distance $L_Y$, or at least 3 times the first distance $L_Y$. The second distance $L_X$ may be 2-10 times the first distance $L_Y$.

Figure 4:
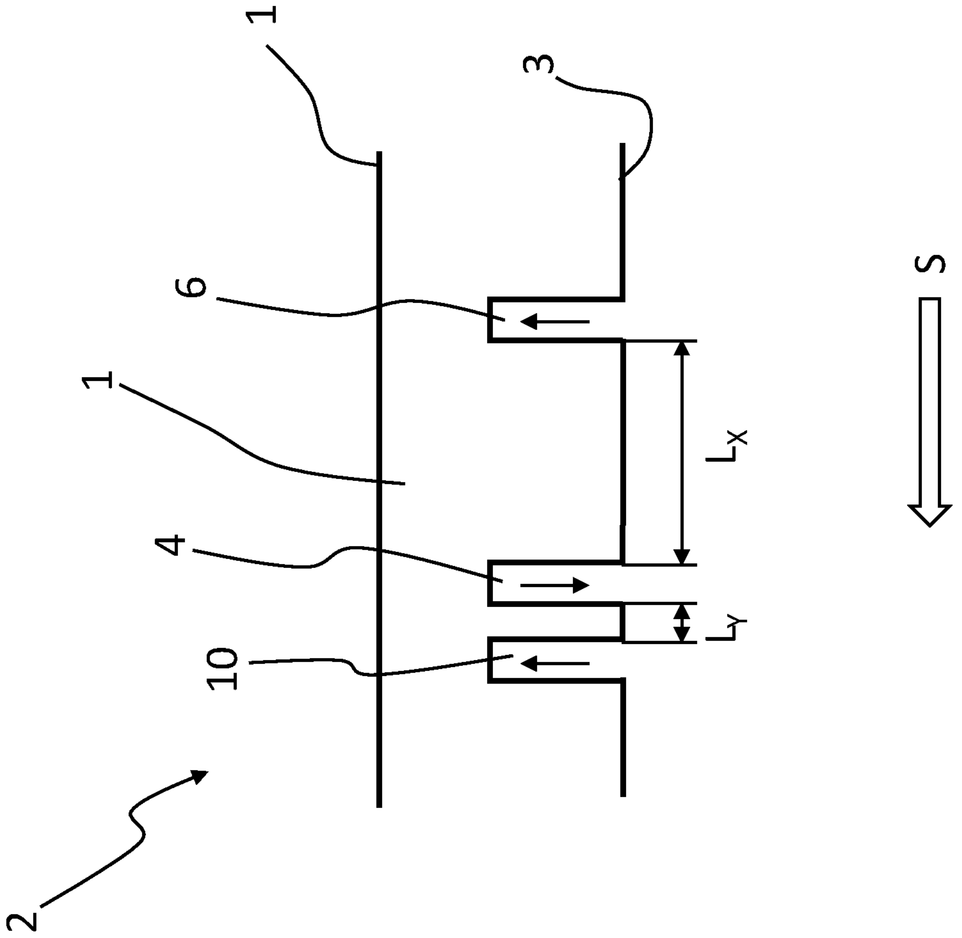

FIG. 4 shows one embodiment of the present invention in which the first zone end nozzle 8 is a discharge nozzle 10. The gas supply nozzle 4 may be a purge gas nozzle or a precursor nozzle. Accordingly, in this embodiment the gas supplied from the gas supply nozzle 4 flows to the discharge nozzle 10, meaning the first zone end nozzle, the distance $L_Y$ and from the gas supply nozzle 4 to the discharge nozzle 6, meaning the second zone end nozzle. The gas zone in this embodiment extends from the first zone end nozzle, or discharge 10, to the second zone end nozzle, meaning the discharge nozzle 6, and thus between the first and second zone end nozzles 10, 6. This is because the gas supplied gas supply nozzle 4 flows to both the first and second zone end nozzles 10, 6.

Figure 5:
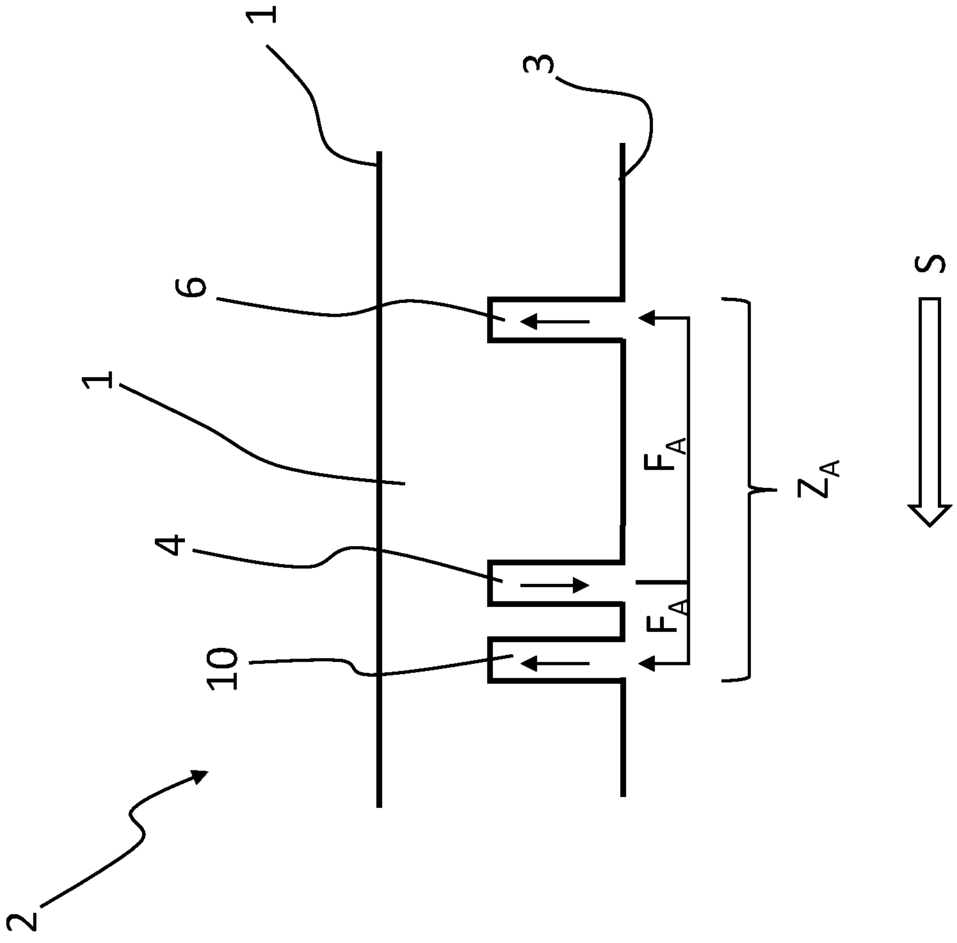

FIG. 5 shows an embodiment, in which the nozzle head 2 comprises a precursor zone $Z_A$ provided between the first zone end nozzle, the discharge nozzle 10 and the second zone end nozzle, discharge nozzle 6, such that the gas supply nozzle 4 is a precursor nozzle arranged to supply precursor A towards the surface of the substrate. The precursor A supplied from the precursor nozzle 4 flows to the first zone end nozzle 10 and from the precursor nozzle 4 to the second zone end nozzle 6 such that precursor flow $F_A$ is formed towards both the first and second zone end nozzles 10, 6. The precursor zone $Z_A$ extends from the first zone end nozzle 10 to the second zone end nozzle 6, and thus between the first and second zone end nozzles 10, 6. Accordingly, the precursor flow $F_A$ travels the longer distance $L_X$ towards the second zone end nozzle 6 and in the direction opposite the transport direction S.

The precursor zone $Z_A$ represents the area on the output face 3 in which the precursor is present and in which the surface of the substrate may be subjected to the precursor.

In an alternative embodiment of FIGS. 4 and 5, the first zone end nozzle 8 may be a discharge nozzle 10 and the gas supply nozzle 4 may be a purge gas nozzle 4 arranged to supply purge gas P towards the surface of the substrate 100 via the output face 3. This embodiment corresponds the embodiment of FIGS. 4 and 5 in which gas supply nozzle 4 is the precursor nozzle. In this embodiment, there is provided a similar purge gas zone $Z_P$ and purge gas flows $F_P$ are provided between the purge gas nozzle and the first zone end nozzle and between the purge gas nozzle and the second zone end nozzle.

In a special embodiment of FIGS. 4 and 5, the first distance $L_Y$ may also correspond or be smaller than the second distance $L_X$ for providing gas flow only in one direction, or only as counter flow to the transport direction S, on the output face 3.

Figure 6:
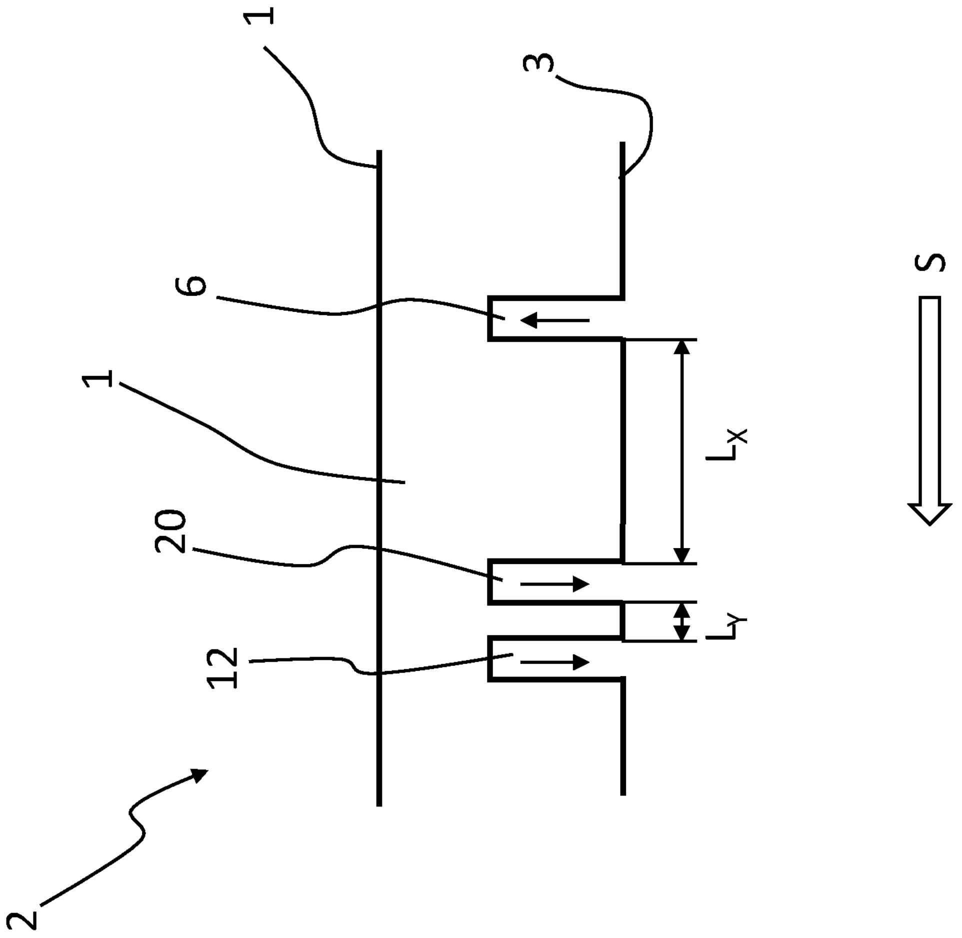

FIG. 6 shows an alternative embodiment, in which the first zone end nozzle 8 is a purge gas nozzle 12 arranged to supply purge gas P towards the surface of the substrate via the output face 3. Otherwise this embodiment corresponds the embodiment of FIGS. 3, 4 and 5. Therefore, the nozzle head 2 comprises on the output face 3 in the following order: the purge nozzle 12, the gas supply nozzle 4 and the discharge nozzle 6, repeated one or more times on the output face 3 in the direction opposite transport direction S of the substrate, as shown in FIG. 6.

The first zone end nozzle, meaning the purge gas nozzle 12, is arranged at the first distance $L_Y$ from the gas supply nozzle 4 and the second zone end nozzle 6 is arranged at the second distance $L_X$ from the gas supply nozzle 4.

In FIG. 6, the gas supply nozzle 4 is a first precursor nozzle 20, arranged to supply first precursor A towards the surface of the substrate via the output face 3. Therefore, the gas supply nozzle or the precursor nozzle 20 is arranged between the purge gas nozzle 12 and the discharge nozzle 6.

Figure 7:
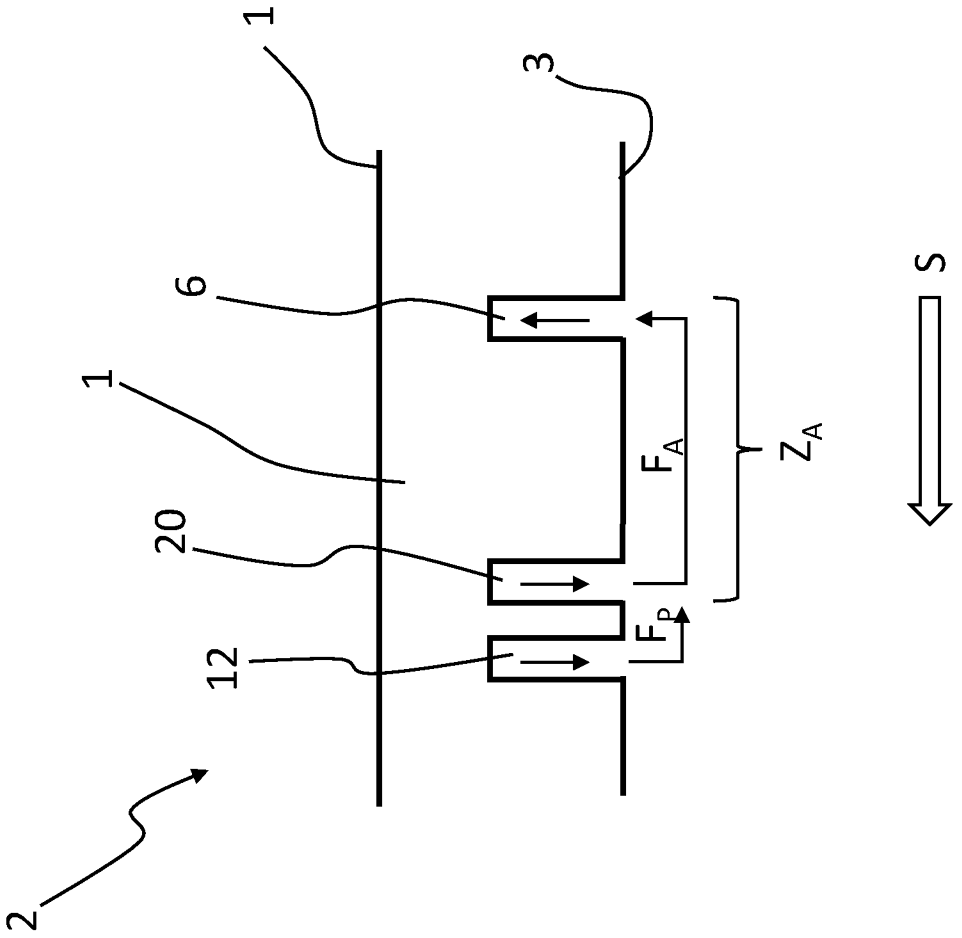

FIG. 7 shows the nozzle head 2 of FIG. 6 comprising the precursor zone $Z_A$. In this embodiment, the precursor zone $Z_A$ extends only from the precursor nozzle 20 to towards or to the second zone end nozzle 6, which is the discharge nozzle. The precursor supplied from the precursor nozzle 20 flows only towards the discharge nozzle 6 or to the discharge nozzle 6 the second distance $L_X$. This occurs because the first zone end nozzle is the purge gas nozzle 12, and thus the purge gas supplied from the purge gas nozzle 12 pushes the precursor towards the discharge nozzle 6. Furthermore, at least part of the purge gas supplied purge gas nozzle 12 flows towards the discharge nozzle 6 or to the discharge nozzle 6.

The precursor zone $Z_A$ represents the area on the output face 3 in which the precursor is present and in which the surface of the substrate may be subjected to the precursor.

Accordingly, in the embodiment of FIGS. 6 and 7 the precursor zone $Z_A$ extends only from the precursor nozzle 20 to the discharge nozzle 6 as there is precursor flow $F_A$ only from the precursor nozzle 20 to the discharge nozzle 6. As shown in FIG. 7, this embodiment provides a counter precursor flow $F_A$ only in the direction opposite the transport direction S.

In an alternative embodiment of FIGS. 6 and 7, the precursor nozzle 20 may be replaced with a purge gas nozzle for providing a purge gas zone. In this embodiment, the purge gas zone extends between the first zone end nozzle 12, which is also a purge gas nozzle, to the second zone end nozzle 6.

Figure 8:
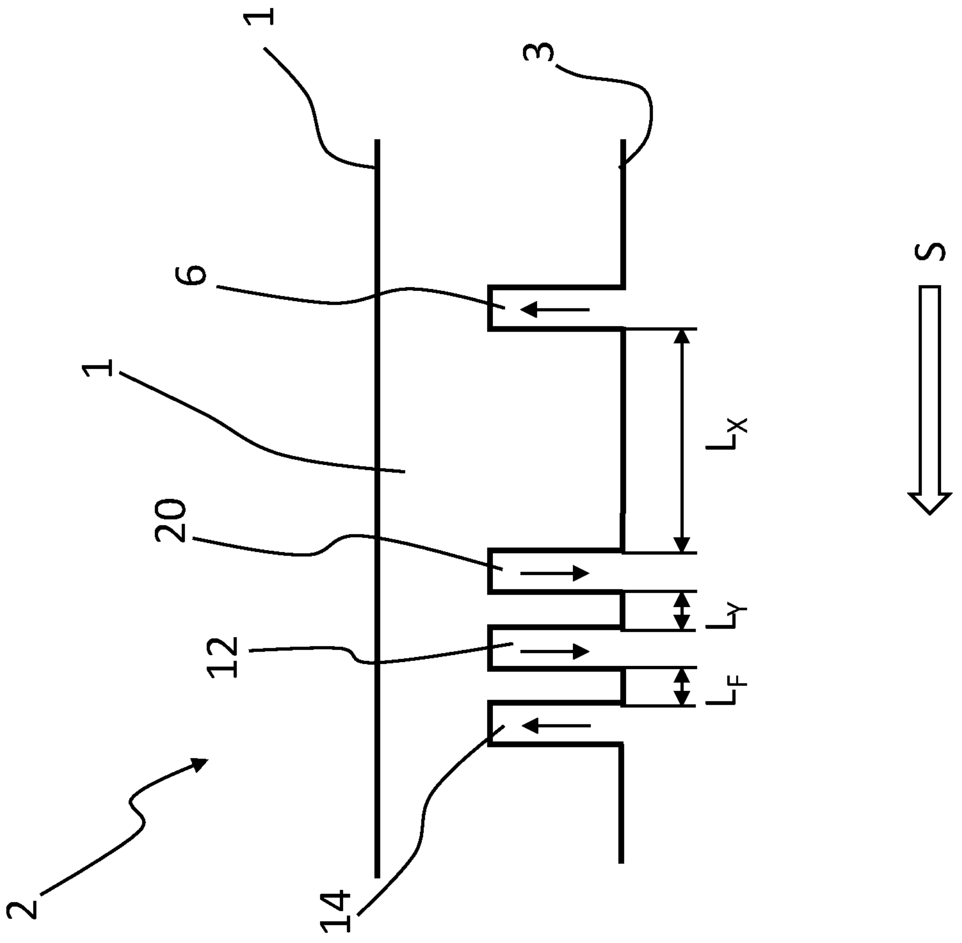
Figure 9:
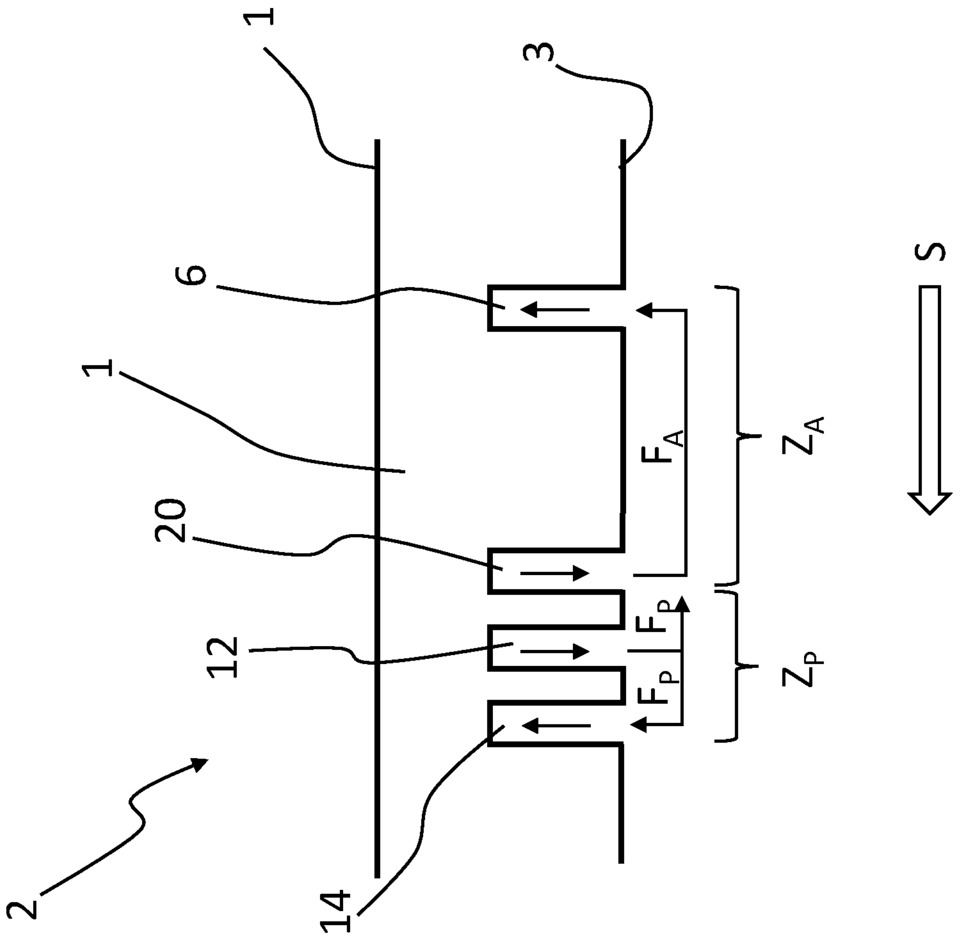

FIGS. 8 and 9 show an embodiment, which is modification of the embodiment of FIGS. 6 and 7. In this embodiment, the nozzle head 2 comprises on the output face 3 in the following order: a discharge nozzle 14, the purge gas nozzle 12, a gas supply nozzle 20, 22, 24 and a discharge nozzle 6, repeated one or more times on the output face 3. Accordingly, this corresponds the embodiment of FIGS. 6 and 7, but there is the discharge nozzle 14 added in front of the purge gas nozzle 12, or the first zone end nozzle, in the direction opposite the transport direction S of the substrate. Thus, the above description of FIGS. 6 and 7 apply also to FIGS. 8 and 9.

The discharge nozzle 14 is arranged at third distance $L_F$ from the first zone end nozzle, or the purge gas nozzle 12. The third distance may preferably correspond the first distance $L_Y$, but it may also be longer or shorter than the first distance $L_Y$.

As shown in FIG. 9, the purge gas supplied from the purge gas nozzle 12, or the first zone end nozzle, flows towards the discharge nozzle 14, and towards the precursor nozzle 20, or the gas supply nozzle, due to the suction provided by the discharge nozzle 6, or the second zone end nozzle 6. Thus, the purge gas flow $F_P$ from the purge gas nozzle 12 is divided into two purge gas flows, as shown in FIG. 9.

It should be noted that usually more purge gas from the purge gas nozzle 12 flows towards the discharge nozzle 14 than towards the second zone end nozzle, or the discharge nozzle 6. This is because, the second zone end nozzle 6 is considerably further from the purge gas nozzle 12 than the discharge nozzle 14. Furthermore, the precursor flow $F_A$ from the precursor nozzle 20 provides counter pressure against the purge gas flow reducing the purge gas flow towards the second zone end nozzle 6 and the in the direction opposite the transport direction S.

The purge gas flow $F_P$ from the purge gas nozzle 12 forms a barrier flow preventing the precursor gas 20 from flowing towards the discharge nozzle 14 and in the transport direction S. Further, the purge gas flow $F_P$ forces the precursor flow towards the second zone end nozzle 6.

As shown in FIG. 9, there is a purge gas zone $Z_P$ extending between the discharge nozzle 14 and the precursor nozzle 20. The purge gas zone $Z_P$ represent an area on the output face 3 where there is only purge gas present. The precursor zone $Z_A$ corresponds the precursor zone $Z_A$ in FIG. 7. The purge gas zone $Z_P$ is provided upstream of the precursor zone $Z_A$ in the direction opposite the transport direction S. Thus, the purge gas zone $Z_P$ purges the surface of the substrate after the precursor zone $Z_A$.

It should be noted, that the precursor nozzle 20 may be replaced with a purge gas nozzle in the embodiment of FIGS. 8 and 9, for providing an extended purge gas zone $Z_P$.

Figure 10:
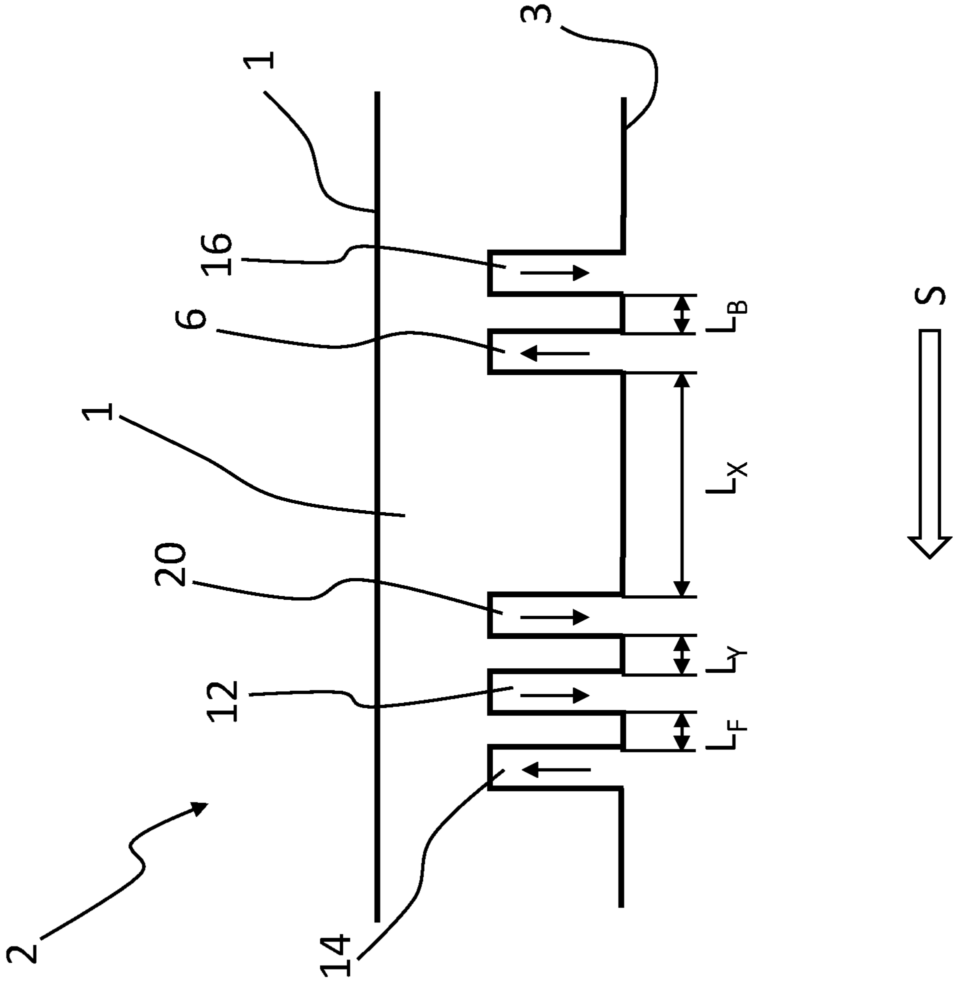
Figure 11:
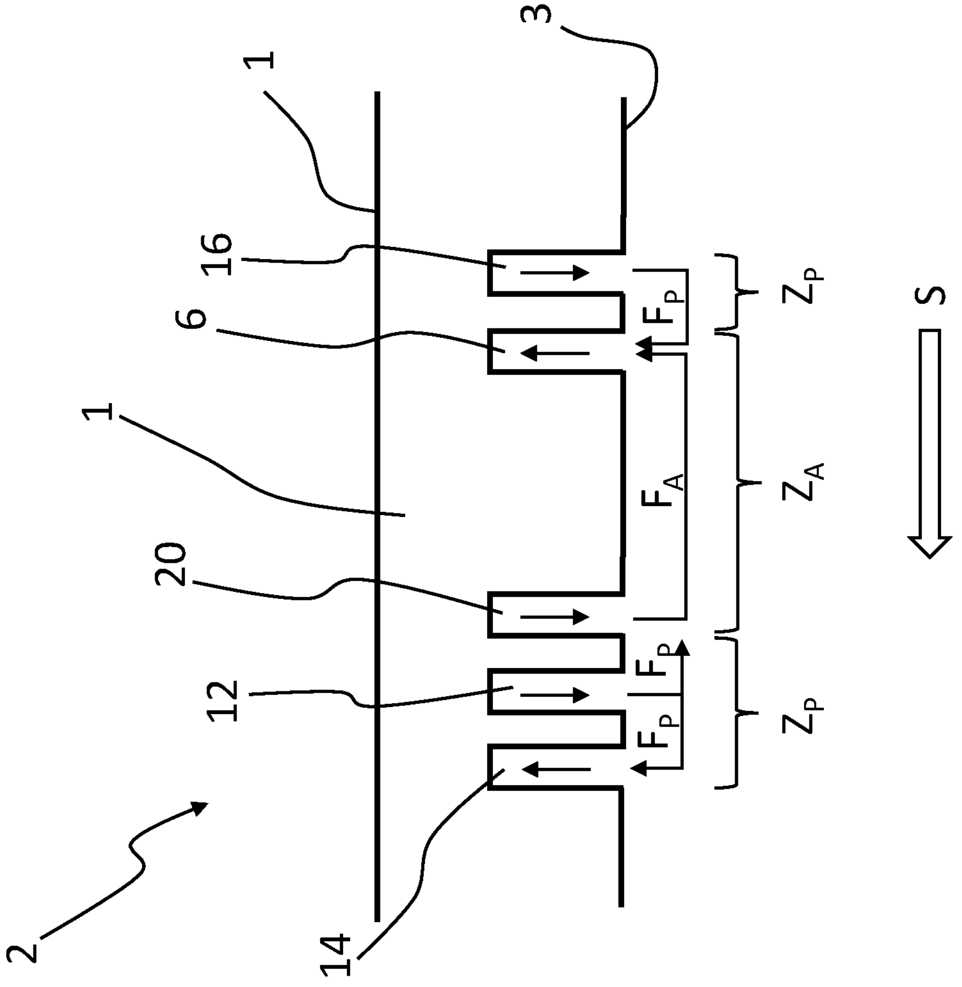

FIGS. 10 and 11 show an alternative embodiment, or modification of the embodiment of FIGS. 8 and 9. The nozzle head 2 comprises on the output face 3 in the following order in the direction opposite transport direction S: the discharge nozzle 14, the purge gas nozzle 12, the gas supply nozzle 20, the discharge nozzle 6 and a purge gas nozzle 16, repeated one or more times on the output face 3. Accordingly, this corresponds the embodiment of FIGS. 8 and 9, but there is the purge gas nozzle 16 added in after of the discharge nozzle 6, or the second zone end nozzle, in the direction opposite the transport direction S of the substrate. Thus, the above description of FIGS. 6, 7, 8 and 9 apply also to FIGS. 10 and 11.

The purge nozzle 16 is arranged at fourth distance $L_B$ from the second zone end nozzle, or the discharge nozzle 6. The fourth distance may preferably correspond the first distance $L_Y$, or the third distance $L_F$, but it may also be longer or shorter than the first distance $L_Y$, or the third distance $L_F$.

As shown in FIG. 11, the purge gas supplied from the purge gas nozzle 16, arranged after the second zone end nozzle 6, flows towards the discharge nozzle 6, or to the discharge nozzle 6, meaning the second zone end nozzle 6, due to the suction provided by the discharge nozzle 6.

The purge gas flow $F_P$ from the purge gas nozzle 16 forms a barrier flow preventing the precursor gas 20 from flowing past the discharge nozzle 6 or the second zone end nozzle in the direction opposite the transport direction S. Further, the purge gas flow $F_P$ from the purge gas nozzle 16 stops the precursor flow $F_A$ at the discharge nozzle 6 and thus provides an end for the precursor zone $Z_A$.

As shown in FIG. 11, there is a purge gas zone $Z_P$ extending between the discharge nozzle 6, meaning the second zone end nozzle, and the purge gas nozzle 16. The purge gas zone $Z_P$ represent an area on the output face 3 where there is only purge gas present. The precursor zone $Z_A$ corresponds the precursor zone $Z_A$ in FIGS. 7 and 9. Accordingly, there is two purge gas zones $Z_P$, one before and one after, or upstream and downstream of the precursor zone $Z_A$ in the direction opposite the transport direction S. Thus, the purge gas zones $Z_P$ purge the surface of the substrate before and after the precursor zone $Z_A$.

It should be noted, that the precursor nozzle 20 may be replaced with a purge gas nozzle in the embodiment of FIGS. 10 and 11, for providing an extended purge gas zone $Z_P$.

Figure 12:
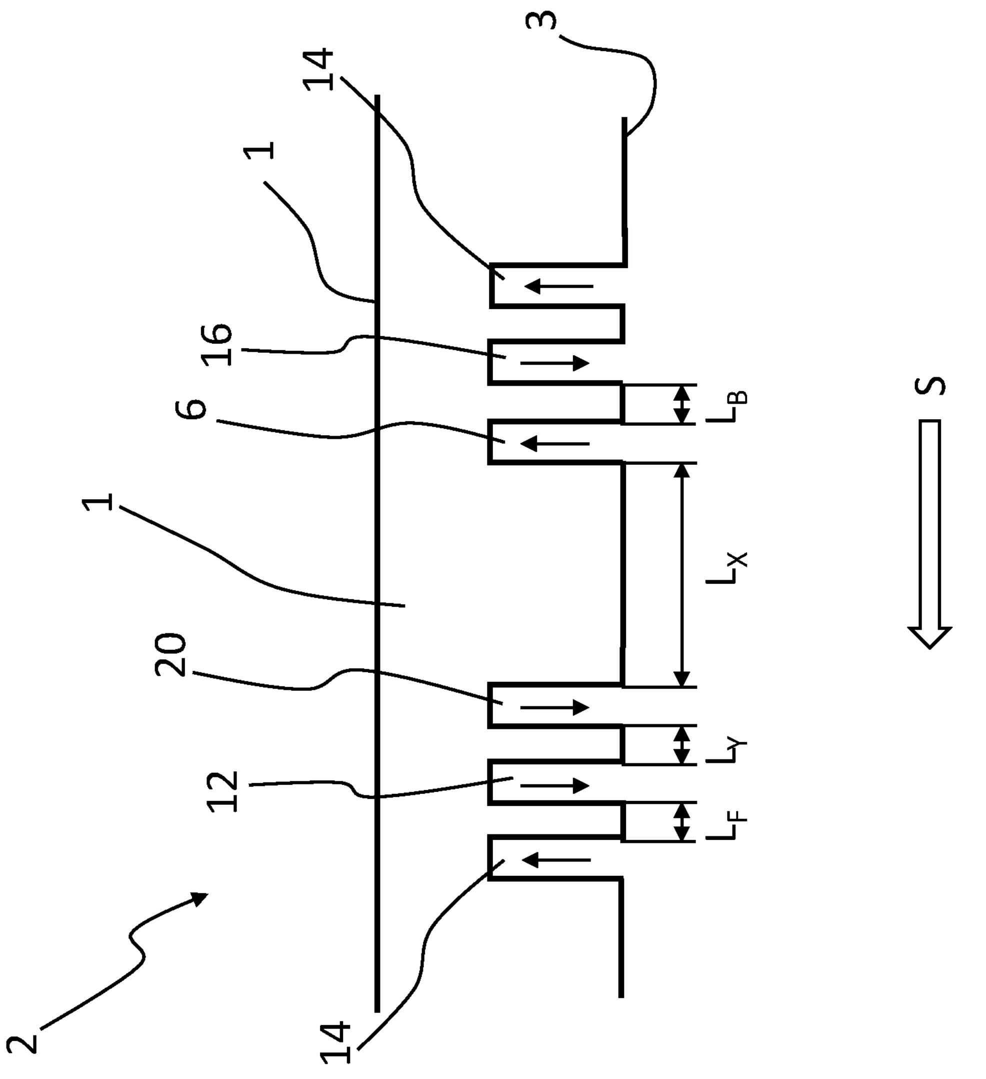
Figure 13:
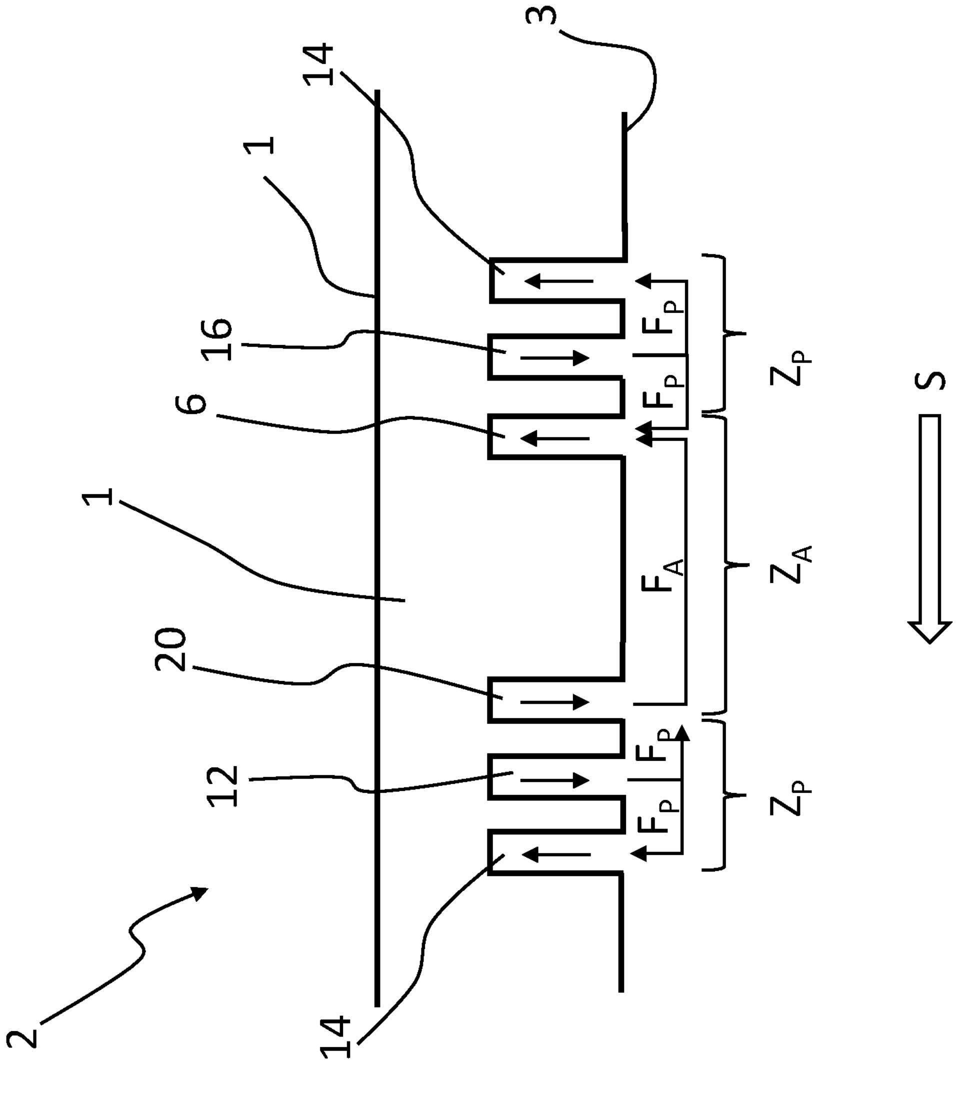

FIGS. 12 and 13 show an alternative embodiment, or modification of the embodiment of FIGS. 10 and 11. The nozzle head 2 comprises on the output face 3 in the following order in the direction opposite transport direction S: the discharge nozzle 14, the purge gas nozzle 12, the gas supply nozzle 20, the discharge nozzle 6, the purge gas nozzle 16 and a discharge nozzle 14, repeated one or more times on the output face 3.

Accordingly, this corresponds the embodiment of FIGS. 10 and 11, but there is the discharge nozzle 14 added in after of the purge gas nozzle 16 in the direction opposite the transport direction S of the substrate. Thus, the above description of FIGS. 6, 7, 8, 9, 10 and 11 apply also to FIGS. 12 and 13.

As shown in FIG. 12, the purge gas nozzle 16 is arranged between the discharge nozzle 6, meaning the second zone end nozzle, and the discharge nozzle 14. Thus, the purge gas supplied from the purge gas nozzle 16, arranged after the second zone end nozzle 6, flows towards the discharge nozzle 6 and towards the discharge nozzle 14 such that the purge gas flow $F_P$ from the purge gas nozzle 16 becomes dived into two purge gas flows $F_P$, as shown in FIG. 13.

As shown in FIG. 13, there is a purge gas zone $Z_P$ extending between the discharge nozzle 6, meaning the second zone end nozzle, and the discharge nozzle 14. The purge gas zone $Z_P$ represent an area on the output face 3 where there is only purge gas present. The precursor zone $Z_A$ corresponds the precursor zone $Z_A$ in FIGS. 7, 9 and 11. Accordingly, there is two purge gas zones $Z_P$, one before and one after, or upstream and downstream of the precursor zone $Z_A$ in the direction opposite the transport direction S. Thus, the purge gas zones $Z_P$ purge the surface of the substrate before and after the precursor zone $Z_A$.

It should be noted, that the precursor nozzle 20 may be replaced with a purge gas nozzle in the embodiment of FIGS. 12 and 13, for providing an extended purge gas zone $Z_P$.

Figure 14:
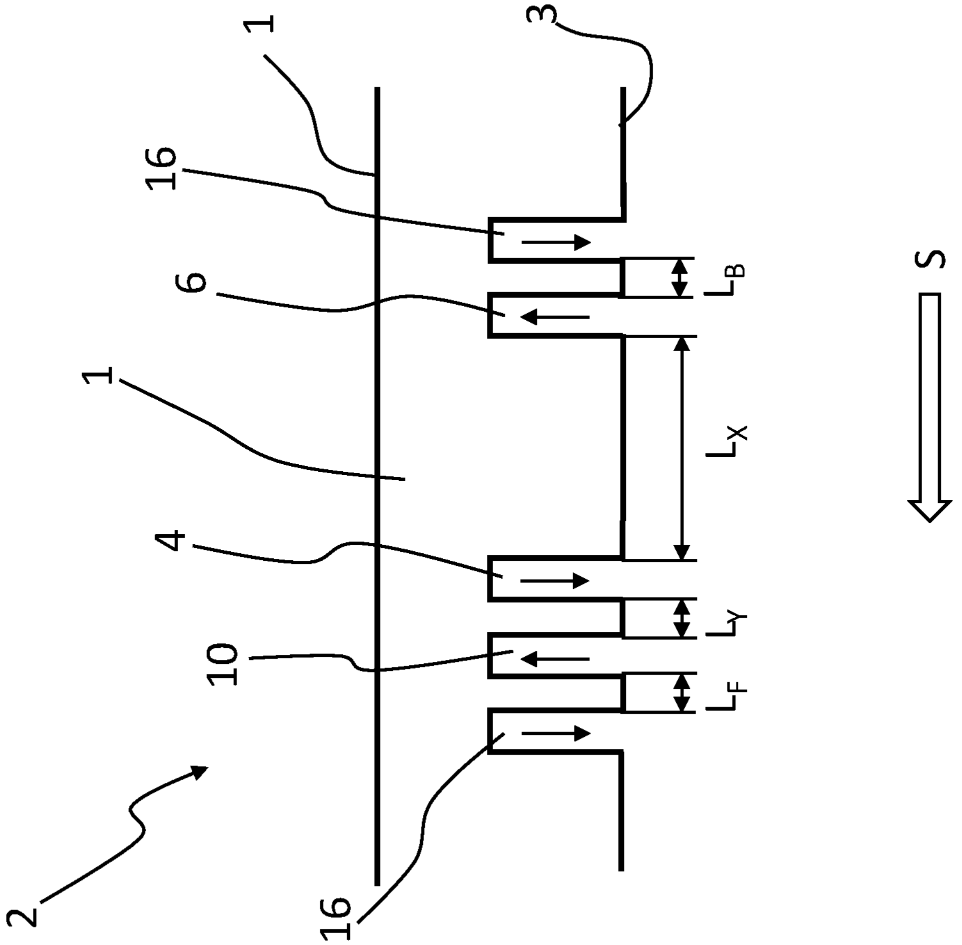
Figure 15:
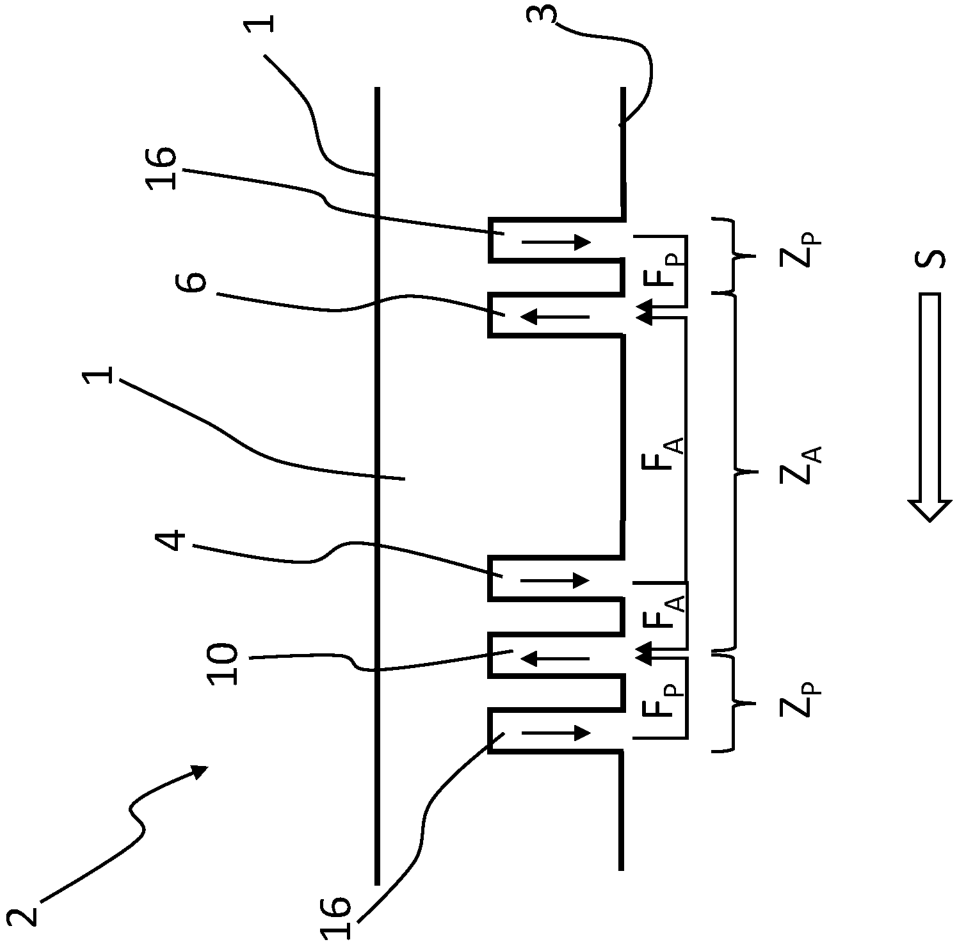

FIGS. 14 and 15 an alternative embodiment and modification the embodiment of FIG. 5, in which the first zone end nozzle 8 is the discharge nozzle 10 arranged to discharge gases from the surface of the substrate via the output face 3. In this embodiment, the gas supply nozzle 4 may be a precursor nozzle or a purge gas nozzle. Accordingly, the nozzle head 2 comprises on the output face 3 in the following order in the direction opposite the transport direction S: the discharge nozzle 10, the gas supply nozzle 4 and the discharge nozzle 6, repeated one or more times on the output face 3 in the direction opposite transport direction S of the substrate, as shown in FIG. 14.

More particularly, the nozzle head 2 comprises on the output face 3 in the following order in the direction opposite the transport direction S: a purge gas nozzle 16, the discharge nozzle 10, the gas supply nozzle 4 and the discharge nozzle 6, repeated one or more times on the output face 3, or a purge gas nozzle 16, the discharge nozzle 10, a gas supply nozzle 4, the discharge nozzle 6 and a purge gas nozzle 16, repeated one or more times on the output face 3.

The first zone end nozzle, meaning the discharge nozzle 10, is arranged at the first distance $L_Y$ from the gas supply nozzle 4 and the second zone end nozzle 6 is arranged at the second distance $L_X$ from the gas supply nozzle 4.

In FIG. 14, the gas supply nozzle 4 is arranged between the two discharge nozzles 10, 6.

The purge gas nozzle 16 arranged upstream of the first zone end nozzle 10 in the direction opposite the transport direction S is arranged at third distance $L_F$ from the first zone end nozzle, or the discharge nozzle 10. The third distance may preferably correspond the first distance $L_Y$, but it may also be longer or shorter than the first distance $L_Y$.

Similarly, the purge gas nozzle 16 arranged downstream of the second zone end nozzle 6 is arranged at fourth distance $L_B$ from the second zone end nozzle, or the discharge nozzle 6. The fourth distance may preferably correspond the first distance $L_Y$, or the third distance $L_F$, but it may also be longer or shorter than the first distance $L_Y$, or the third distance $L_F$.

As shown in FIG. 15, the gas flow $F_A$ supplied from the gas supply nozzle 4 flows towards the first zone end nozzle, meaning the discharge nozzle 10, and towards the second zone end nozzle, meaning the discharge nozzle 6. Thus, the gas supply nozzle 4 is arranged on the output face 3 between the two discharge nozzles 10, 6 such that gas zone $Z_A$ is formed between the discharge nozzles 10, 6, or the first and second zone end nozzles, as shown in FIG. 15. The gas supplied from gas supply nozzle 4 flows on the output face 3 a longer distance $L_X$ towards the second zone end nozzle 6. Further, the gas zone $Z_A$ extends between the first and second zone end nozzles 10, 6.

The purge gas supplied from the purge gas nozzle 16 arranged upstream of the first zone end nozzle 10 in the direction opposite the transport direction S flow towards the first end zone nozzle 10 forming the purge gas flow FP and the purge gas zone $Z_P$. Similarly, purge gas supplied from the purge gas nozzle 16 arranged downstream of the second zone end nozzle 6 flow towards the second end zone nozzle 6 forming the purge gas flow $F_P$ and the purge gas zone $Z_P$. Thus, the purge gas zones $Z_P$ extend between the purge gas nozzle 16 and the first or second zone end nozzle 10, 6, respectively.

Therefore, the gas zone $Z_A$ is provided between the two purge gas zones $Z_P$.

Figure 16:
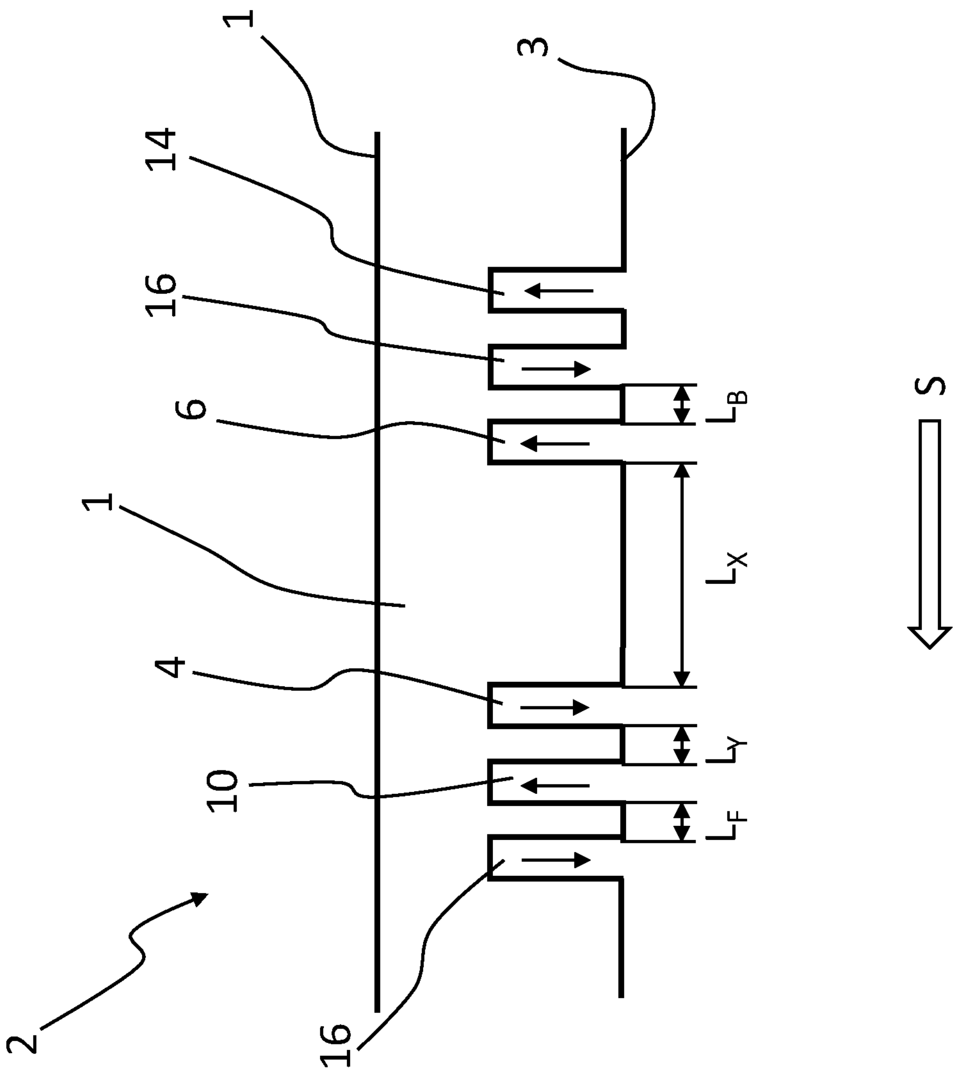
Figure 17:
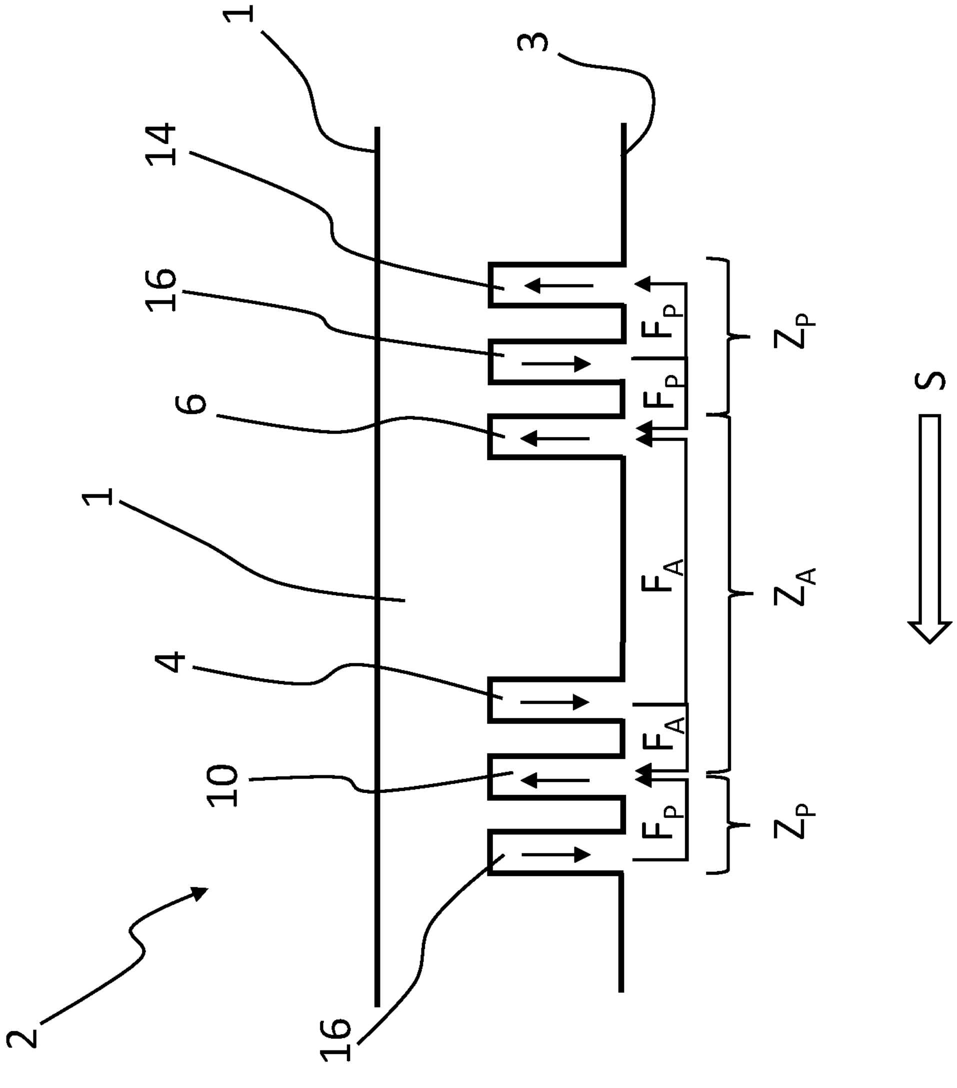

FIGS. 16 and 17 show an alternative embodiment, or modification of the embodiment of FIGS. 14 and 15. The nozzle head 2 comprises on the output face 3 in the following order in the direction opposite transport direction S: the purge gas nozzle 16, discharge nozzle 10, gas supply nozzle 4, the discharge nozzle 6, the purge gas nozzle 16 and the discharge nozzle 14, repeated one or more times on the output face 3.

Accordingly, this corresponds the embodiment of FIGS. 14 and 15, but there is the discharge nozzle 14 added in after of the purge gas nozzle 16, or the second zone end nozzle, in the direction opposite the transport direction S of the substrate. Thus, the above description of FIGS. 14 and 15 apply also to FIGS. 16 and 17.

As shown in FIG. 16, the purge gas nozzle 16 is arranged between the discharge nozzle 6, meaning the second zone end nozzle, and the discharge nozzle 14. Thus, the purge gas supplied from the purge gas nozzle 16, arranged after the second zone end nozzle 6, flows towards the discharge nozzle 6 and towards the discharge nozzle 14 such that the purge gas flow $F_P$ from the purge gas nozzle 16 becomes dived into two purge gas flows $F_P$, as shown in FIG. 17.

As shown in FIG. 17, there is a purge gas zone $Z_P$ extending between the discharge nozzle 6, meaning the second zone end nozzle, and the discharge nozzle 14. The purge gas zone $Z_P$ represent an area on the output face 3 where there is only purge gas present. The gas zone $Z_A$ corresponds the gas zone $Z_A$ in FIGS. 14 and 15. Accordingly, there is two purge gas zones $Z_P$, one before and one after, or upstream and downstream of the gas zone $Z_A$ in the direction opposite the transport direction S. Thus, the purge gas zones $Z_P$ purge the surface of the substrate before and after the gas zone $Z_A$.

Figure 18:
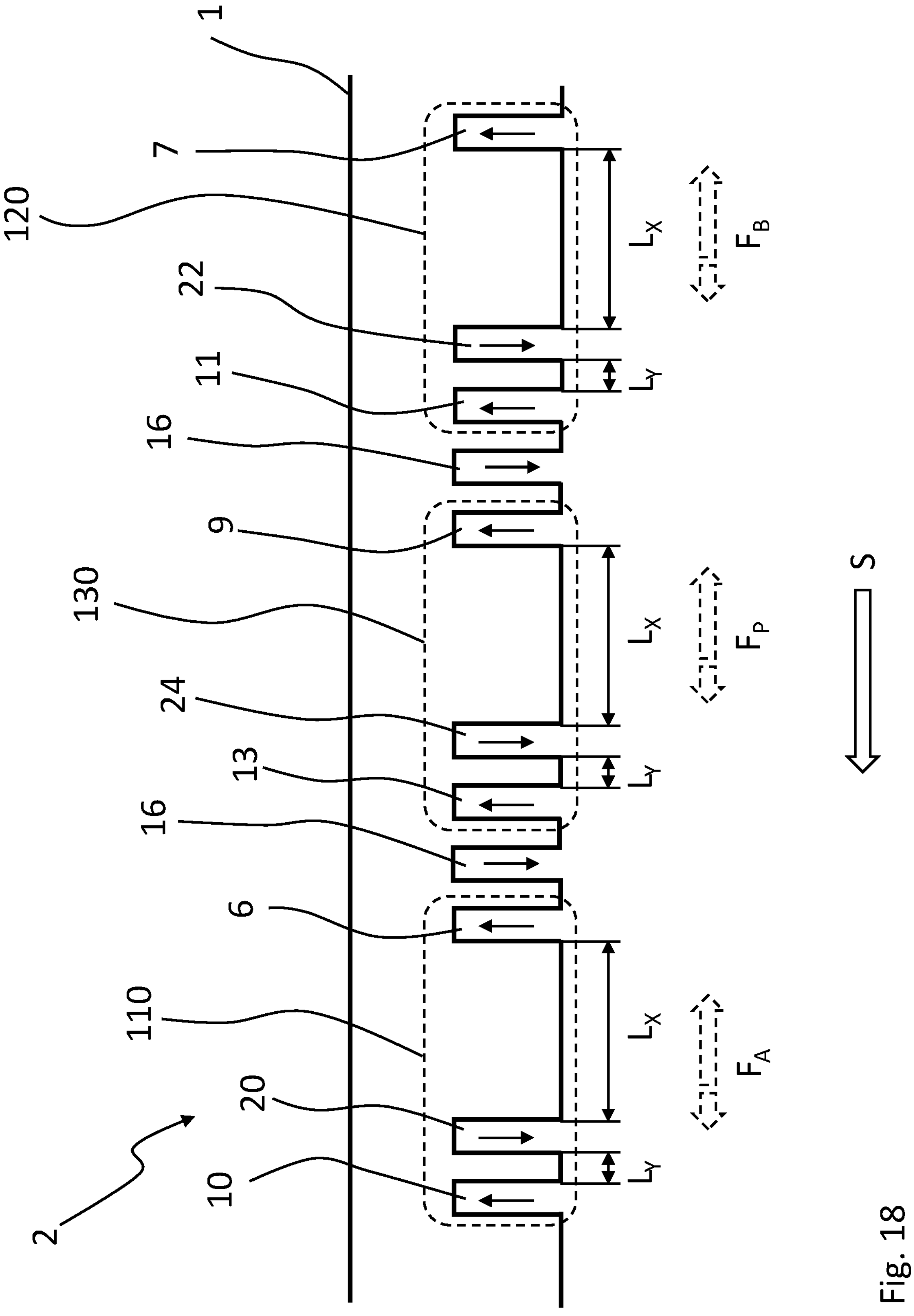

FIG. 18 shows one embodiment of a nozzle head in which there is three nozzle configurations according to the present invention provided on the output face 3 of the nozzle head 2. In this embodiment, there are three nozzle configurations 110, 120, 130 according to FIGS. 4, 5 14, 15, 16 and 17. This means that there are three nozzle configurations 110, 120, 130 in which the first zone end nozzle is a discharge nozzle 10, 11, 13 and the second zone end nozzle is also a discharge nozzle 6, 9, 7, as shown in FIG. 18.

As shown in FIG. 18, the first nozzle configuration 110 comprises discharge nozzles 10, 6 as the first and second zone end nozzles, and a first precursor nozzle 20 arranged to supply first precursor A towards the surface of the substrate. Further, the second nozzle configuration 120 comprises discharge nozzles 11, 7 as the first and second zone end nozzles, and a second precursor nozzle 22 arranged to supply first precursor B towards the surface of the substrate. Between the first and second nozzle configurations is provided a third nozzle configuration which comprises discharge nozzles 13, 9 as the first and second zone end nozzles, and a purge nozzle 24 arranged to supply purge towards the surface of the substrate. As, shown in FIG. 18, the in all the nozzle configurations 110, 120, 130 the first zone end nozzles 10, 11, 13 are arranged at a first distance $L_Y$ from the precursor nozzle 20, 22 or the purge gas nozzle 24 and the second zone end nozzle 6 is arranged at a second distance $L_X$ from the precursor nozzle 20, 22 or the purge gas nozzle 24. The second distance $L_X$ is greater than the first distance $L_Y$. Thus, the gases supplied from the nozzles 20, 22, 24 provide flows $F_A$, $F_B$ and $F_P$ flow in two direction, but a longer distance on the output face 3 in the direction opposite the transport direction S, as shown with the arrows in FIG. 18. Accordingly, the first nozzle configuration 110 forms a first precursor zone, the second nozzle configuration 120 forms a second precursor zone and the third nozzle configuration 130 forms a purge gas zone.

Figure 19:
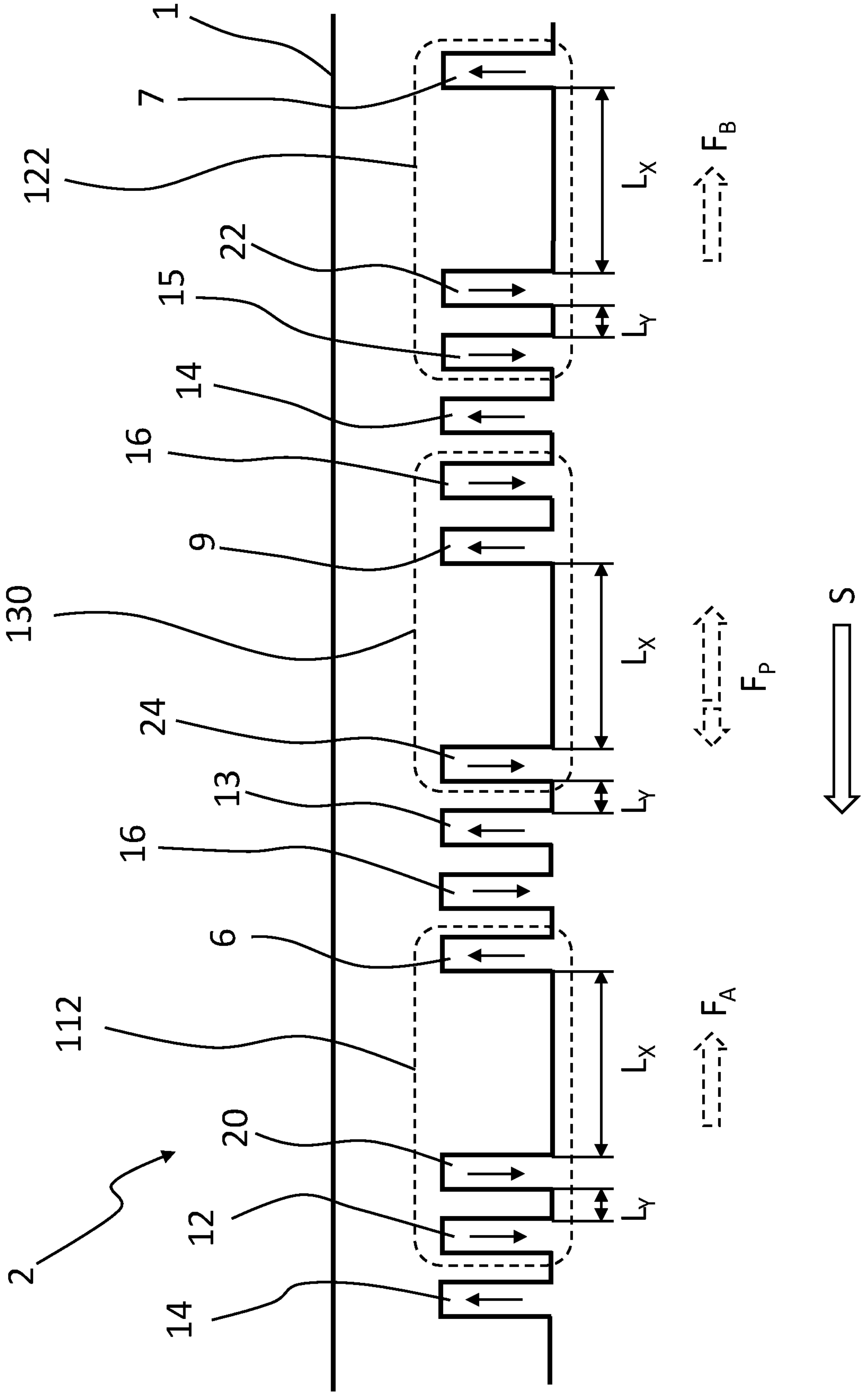

FIG. 19, shows on alternative embodiment, in this embodiment the third nozzle configuration 130, purge gas zone, corresponds the embodiment of FIG. 18. In this embodiment, the first and second configurations 112, 122 are formed according to FIGS. 6, 7, 8, 9, 10, 11, 12 and 13. This means that in the first and second nozzle configurations the first zone end nozzle is a purge gas nozzle 12, 15 and the second zone end nozzle is the discharge nozzle 6, 7, as shown in FIG. 19.

As shown in FIG. 19, the first nozzle configuration 112 comprises the purge gas nozzle 12, the first precursor nozzle 20 and the discharge nozzle 6 in the direction opposite the transport direction S. Similarly, the second nozzle configuration 122 comprises the purge gas nozzle 15, the second precursor nozzle 22 and the discharge nozzle 7 in the direction opposite the transport direction S. Between the first and second nozzle configurations is provided the third nozzle configuration 130 which comprises discharge nozzles 13, 9 as the first and second zone end nozzles, and a purge nozzle 24 arranged to supply purge towards the surface of the substrate. As, shown in FIG. 19, the in all the nozzle configurations 112, 122, 130 the first zone end nozzles 10, 11, 13 are arranged at a first distance $L_Y$ from the precursor nozzle 20, 22 or the purge gas nozzle 24 and the second zone end nozzle 6 is arranged at a second distance $L_X$ from the precursor nozzle 20, 22 or the purge gas nozzle 24. In this embodiment, the precursors A, B supplied from the precursor nozzles 20, 22 provide flows $F_A$ and $F_B$ flowing only in the direction opposite the transport direction S, as shown with the arrows in FIG. 19 and described previously. Accordingly, the first nozzle configuration 112 forms a first precursor zone, the second nozzle configuration 122 forms a second precursor zone and the third nozzle configuration 130 forms a purge gas zone.

Figure 20:
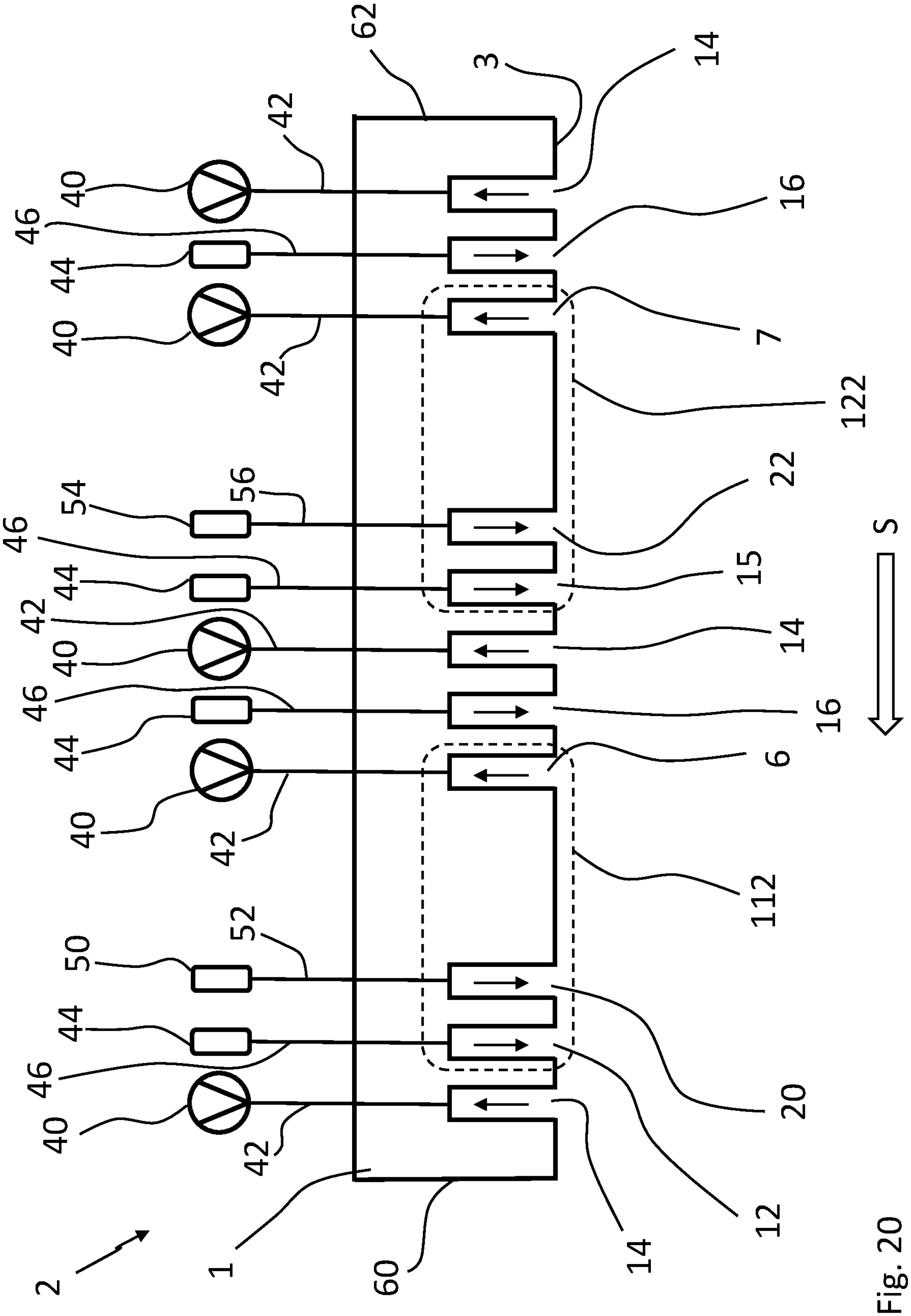

FIG. 20 shows an alternative embodiment in which the is no third nozzle configuration 130 and the first and second nozzle configurations correspond the nozzle configurations of FIG. 19. Accordingly, between the first and second nozzle configuration 112, 122 there is provided a purge gas nozzle 16 and a discharge nozzle 14, in the direction opposite the transport direction S, such that a purge gas zone is formed between the first and second nozzle configuration 112, 122.

There is a pump, vacuum pump or a vacuum devices 40 connected to each discharge nozzle 14, 6, 7 with a discharge line 42 for discharging gases via the discharge nozzles 14, 6, 7. There may be separate vacuum devices 40 or one or more common vacuum device for two or more discharge nozzles 14, 6, 7. This may be applied to all embodiments of the present invention. Furthermore, there is purge gas sources 44 connected to purge gas nozzles 12, 16, 15 with a purge gas line 46 for supplying purge gas P from the purge gas source 44 to the purge gas nozzles 12, 16, 15. There may be separate purge gas sources 44 or one or more common purge gas source 44 for two or more purge gas nozzles 12, 16, 15.

The first precursor nozzle 20 is connected to a first precursor source 50 with a first precursor line 52 for supplying first precursor A from the first precursor source 50 to the first precursor nozzle 20. The first precursor source 50 may be connected to one or more first precursor nozzles 20 and there may also be more than one first precursor sources 50. The second precursor nozzle 22 is connected to a second precursor source 54 with a second precursor line 56 for supplying second precursor B from the second precursor source 54 to the second precursor nozzle 22. The second precursor source 54 may be connected to one or more second precursor nozzles 22 and there may also be more than one second precursor sources 56. The first and second precursor sources 50, 54 and the first and second precursor lines 52, 56 may be applied in all the embodiment of the present invention.

Further, the vacuum devices 40, the purge gas source 44 and the precursor sources 50, 54 and the respective lines 42, 46, 52, 56 may form precursor system of an apparatus comprising the nozzle head 2.

Figure 21:
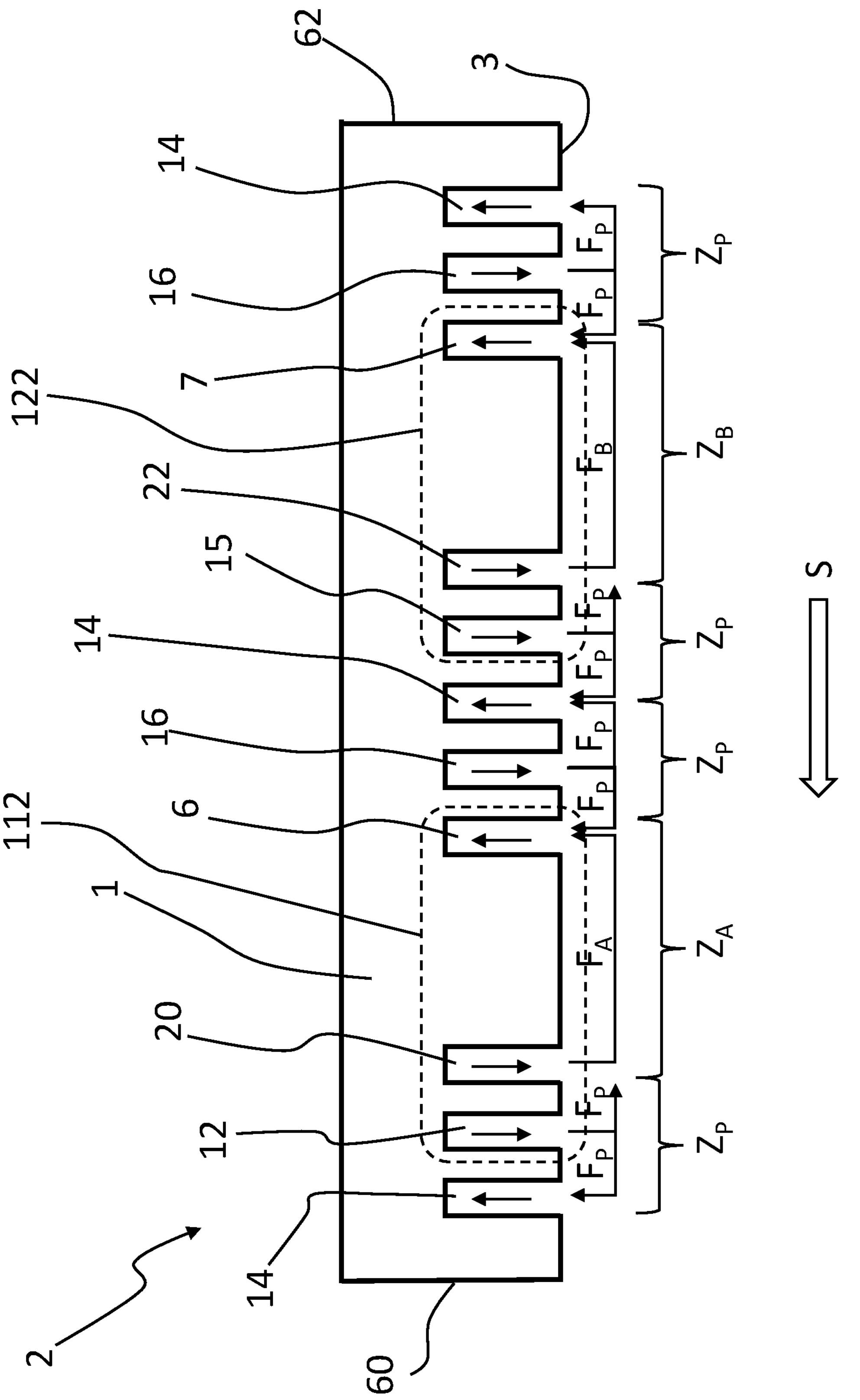

FIG. 21 shows gas flows and gas zones of the embodiment of FIG. 20. As shown in FIG. 21 and described previously, the first and second precursor flows $F_A$ and $F_B$ flow on in the direction opposite the transport direction S of the substrate. Thus, the first precursor zone $Z_A$ extends between the first precursor nozzle 20 and the second zone end nozzle 6 of the first nozzle configuration 112. Similarly, the second precursor zone $Z_B$ extends between the second precursor nozzle 22 and the second zone end nozzle 7 of the second nozzle configuration 122.

Figure 22:
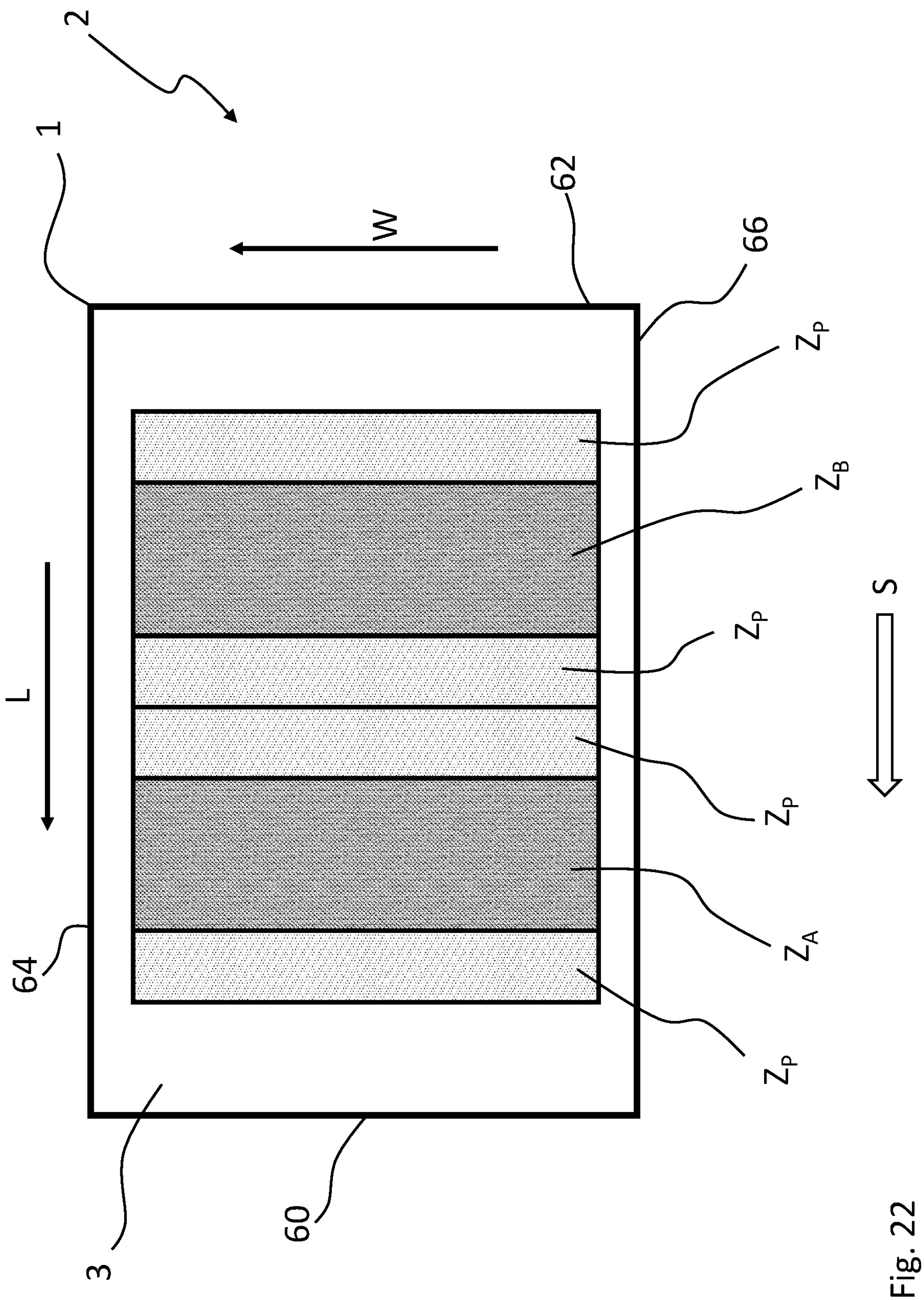

Furthermore, there is provided purge gas zones $Z_P$ upstream, downstream and between the first and second precursor zones $Z_A$, $Z_B$ in the direction opposite the transport direction S, as shown in FIG. 22.

FIG. 22 shows a schematic representation of the first and second precursor zones $Z_A$, $Z_B$ and the purge gas zones $Z_P$ on the output face 3 of the nozzle head 2 according to the embodiment of FIG. 21.

It should be noted, that nozzle head 2 may comprise any combination of the nozzle configurations 110, 112, 120, 122, 130 provided on the output face 3 and the present invention is not limited to any combination of the nozzle configurations 110, 112, 120, 122, 130.

Figure 23:
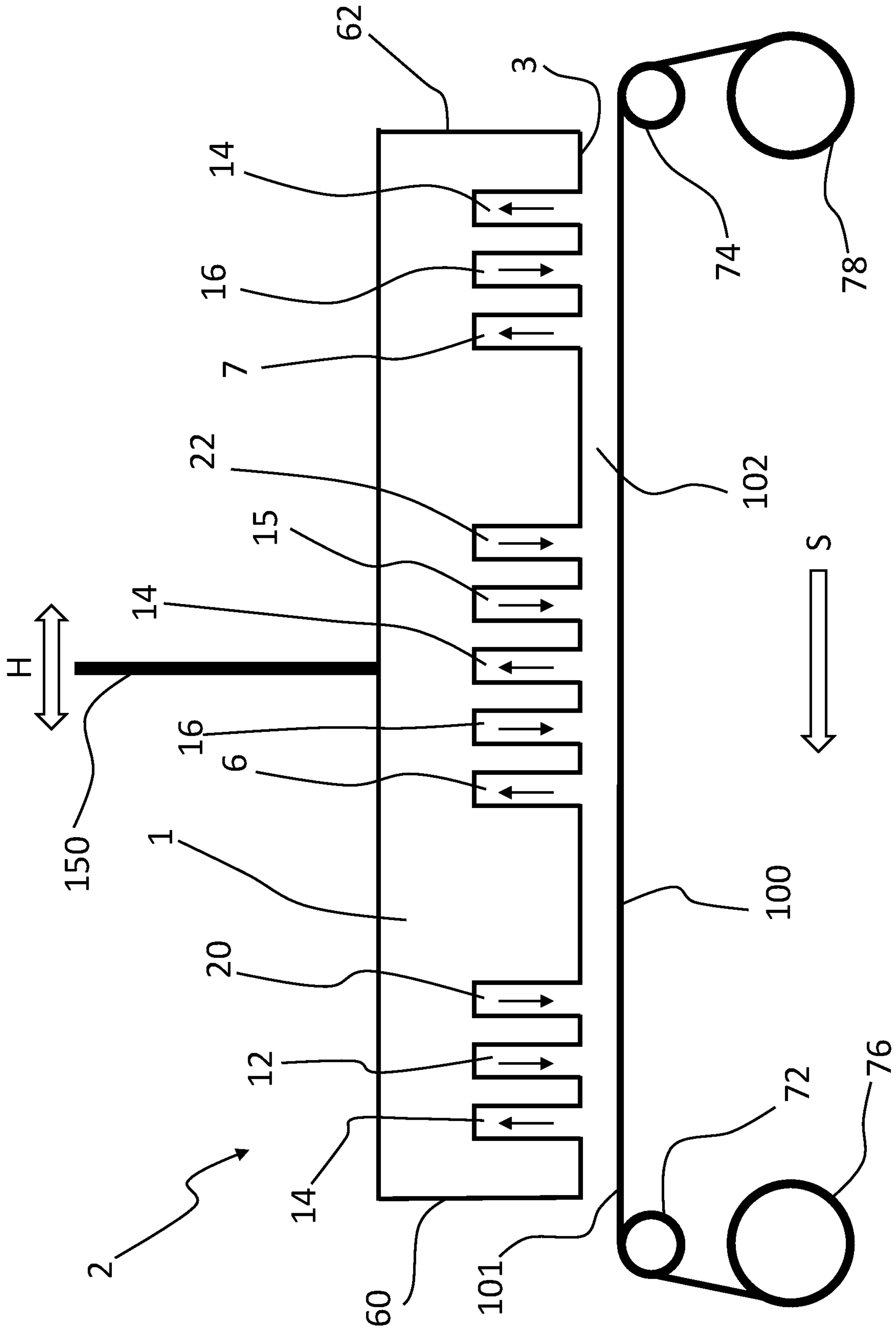
FIG. 23 shows one embodiment of an apparatus according to the present invention.

FIG. 23 shows an apparatus for subjecting a surface 101 of a substrate 100 to alternate surface reactions of at least two precursors A, B according to principles of atomic layer deposition and according to the present invention. The apparatus comprises the nozzle head 2 having an output face 3 via which the gases A, B, P are supplied towards the surface 101 of the substrate 100. The nozzle head 2 of FIG. 23 corresponds the nozzle head of FIGS. 20, 21, but the nozzle head 2 may be any nozzle head 2 according to the present invention.

The apparatus further comprises a transport mechanism arranged to transport the substrate 100 in a transport direction S relative to the nozzle head 2 for subjecting the surface 101 of the substrate 100 to alternate surface reactions of the at least two precursors A, B. The transport mechanism may be known kind of transport mechanism for transporting the substrate 100 arranged to transport substrate 100 past the output face 3 of the nozzle head 2 in the transport direction S.

As shown in FIG. 23, the substrate 100 is transported or supported opposite or in front of the output face 3 such that the surface 101 of the substrate 100 is at a distance from the output face 3. Thus, a reaction space 11 is formed between the output face 3 and the surface 101 of the substrate 100. The gases from the nozzle head 2 are supplied to the reaction space 11 via the output face 3.

In FIG. 23 the substrate 100 is flexible web-like belt-like substrate 100 which is transported from a first substrate roll 78 to a second transport roll 76 in the transport direction S. The transport mechanism comprises at least one drive roll 72 connected to driving means for rotating the drive roll 72 for transporting the substrate 100. The transport mechanism may also comprise one or more free rolls 74 for supporting substrate 100. Furthermore, the first and/or second substrate roll 78, 76 may be a drive roll connected to driving means for rotating the substrate roll 78, 76.

According to the present invention the nozzle head 2 of the apparatus comprises on the output face 3 at least one gas zone $Z_A$, $Z_B$, $Z_P$ comprising the gas supply nozzle 4 arranged to supply gas towards the surface 101 of the substrate 100 via the output face 3. The at least one gas zone $Z_A$, $Z_B$, $Z_P$ extends in the transport direction S the first distance $L_Y$ from the gas supply nozzle 4 to the adjacent first zone end nozzle 8 and in the direction opposite the transport direction S the second distance $L_X$ from the gas supply nozzle 4 to the adjacent second zone end nozzle 6. The second distance $L_X$ in the direction opposite the transport direction S is greater than the first distance $L_Y$ in the transport direction S.

In one special embodiment of the apparatus, the second distance $L_X$ may correspond the first distance $L_Y$, or the second distance LX may even be shorter than first distance LY when the first zone end nozzle 8 is a purge gas nozzle and the second zone end nozzle 6 is a discharge nozzle such that the gas supplied from the gas supply nozzle 4 flows only in one direction on the output face 3.

The apparatus of the present invention may also comprise a moving mechanism 150 arranged to move the nozzle head 2 relative to the substrate 100 or relative to the transport mechanism 72, 74, 76, 78 in the direction opposite to the transport direction S or with reciprocating movement H parallel to the surface 101 of the substrate 100, in the transport direction S and in the opposite direction in relation to the transport direction S.

The present invention further provides a method for subjecting the surface 101 of the substrate 100 to alternate surface reactions of at least two precursors A, B according to principles of atomic layer deposition by utilizing a nozzle head 2 having the output face 3 via which at least one precursor A, B is supplied on the surface 101 of the substrate 100 The method comprises forming the reaction space 11 between the output face 3 of the nozzle head 2 and the surface 101 of the substrate 100, transporting the substrate 8 in the transport direction S relative to the nozzle head 2 and supplying at least one gas A, B, P to the reaction space 11 from the nozzle head 2 via the output face.

According to the present invention the method further comprises supplying the at least one gas A, B, P into the reaction space 11 such that the at least one gas A, B, P flows in the reaction space 11 along the output face 3 of the nozzle head 2 a longer distance $L_X$ in a direction opposite the transport direction S than in the transport direction S. Thus, a counter flow of gas is formed in the reaction space 11.

The method may be implemented with any of the embodiments of the nozzle head and the apparatus as disclosed above.

In one embodiment method further comprises supplying the at least one gas A, B, P into the reaction space 11 such that the at least one gas A, B, P flows in the reaction space 11 along the output face 3 of the nozzle head 2 a first distance $L_Y$ in the transport direction S and a second distance $L_X$ in the direction opposite the transport direction S, the second distance $L_X$ being greater than the first distance $L_Y$. This may be achieved such that a gas flow is supplied from the output face 3 to the reaction space 11 and discharged on opposite sides of the gas supply such that the gas is discharge at the first distance $L_Y$ from the gas supply on first side of the gas supply and at the second distance $L_X$ from the gas supply on the second side. Accordingly, this may be achieved such that the gas flow is supplied from the output face 3 to the reaction space 11 from a gas supply nozzle 4, and discharged on opposite sides of the gas supply nozzle with discharge nozzles 10, 6 such that a first discharge nozzle 10 is at the first distance $L_Y$ from the gas supply nozzle 4 and the second discharge nozzle 6 is at the second distance $L_X$ from the gas supply nozzle 4.

In this embodiment, the gas supplied from the gas supply nozzle may be for example precursor gas or purge gas.

In an alternative embodiment, the method comprises supplying the gas A, B, P into the reaction space 11 such that the gas A, B, P flows in the reaction space 11 along the output face 3 of the nozzle head 2 only in direction which is opposite to the transport direction S. This may be achieved for such that first gas flow is supplied from the output face 3 to the reaction space 11, a second gas flow is supplied to the reaction on first side of the first gas flow and the first and second gas flow are discharged from the reaction space 11 on second side of the first gas flow, the second side being opposite side of the first gas flow in relation to the to the first side. Accordingly, this may be achieved such that the first gas flow is supplied from the output face 3 to the reaction space 11 from a first gas supply nozzle 4, the second gas flow is supplied to the reaction space 11 from a second gas supply nozzle 12 on first side of the first gas supply nozzle 4, and the first and second gas flows are discharged from the reaction space 11 via a discharge nozzle 6 on second side of the first gas supply nozzle 4, the second side being opposite side of the first gas supply nozzle 4 in relation to the to the first side.

In this embodiment, the first gas flow may be for example a precursor gas flow and the second gas flow a purge gas flow.

Figure 24:
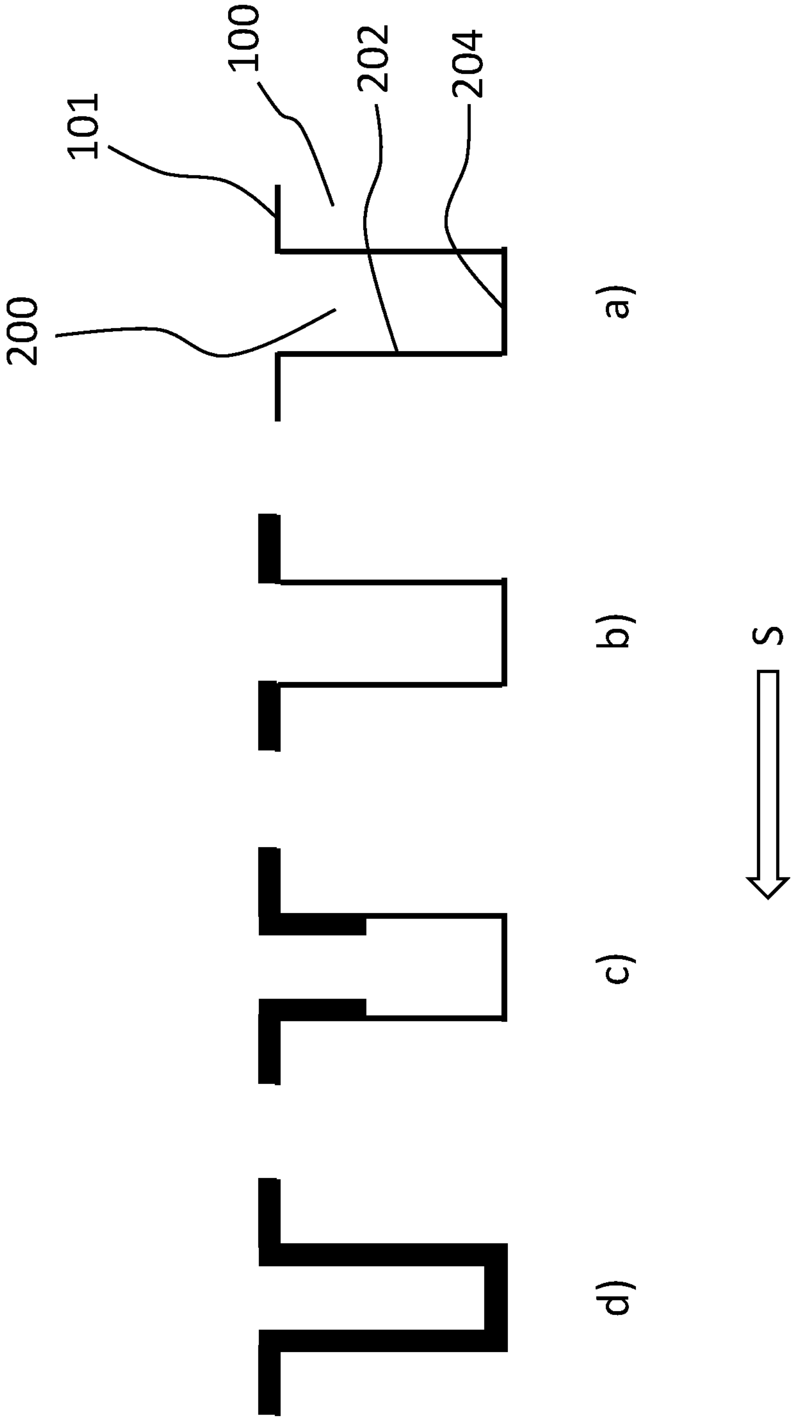
FIG. 24 shows the principle of providing a coating on all surfaces of a pore or pinhole in the surface of the substrate.

FIG. 24 shows coating of a pore 200 extending from the surface 101 of the substrate 100 into the substrate 100. The Pore 200 comprises side walls 202 and a bottom 204. Step a) shows the pore before providing a coating and before subjecting the substrate to surface reactions according to the atomic layer deposition. Step b) shows the pore at the beginning of a coating cycle in which the surface 101 of the substrate is subjected successively to at least two different precursors. At the beginning the precursors react on surface locations which are easily or immediately and quickly accessible by the precursor gases. The pores 200 are usually very small and thus the precursor gases reach the pores by diffusion. The diffusion of the precursor gases is rather slow and it may be speeded up by increasing the concentration or vapour pressure of the precursor gas on the surface 101 of the substrate 100. In step c) the precursor gases have reached the upper part of the side walls 202 of the pore 200, but the precursors have not reached the bottom 204 of the pore 200 and the lower parts of the side walls 202. This is normal situation with prior art nozzle heads, apparatuses and methods. Thus, the bottom 204 and the lower parts of the side walls 202 remain uncoated.

The above described present invention enables also to coat the bottom 204 and the lower parts of the side walls 202 of the pores 200. This is due to the increased coating time and distance in the counter flow direction, meaning the direction opposite the transport direction S of the substrate 100 in relation to the nozzle head 2. Thus, the step d) in which also the bottom 204 and the lower parts of the side walls 202 are coated may be achieved.

This is achieved as the surface 101 of the substrate 100 first is subjected to precursor flow at the distal end of the extended precursor zone at the second zone nozzle end where the precursor concentration is at the lowest. Thus, the easily accessible surface locations are first subjected to saturated surface reaction. Then, the precursor concentration increases as the substrate 100 moves towards the precursor nozzle and the precursor may more easily reach the more difficult surface locations as the precursor does not react any more on the easily accessible surface locations. Furthermore, the extended precursor zone provides more time for the surface reactions.

The invention has been described above with reference to the examples shown in the figures. However, the invention is in no way restricted to the above examples but may vary within the scope of the claims.

The invention claimed is:

1. A nozzle head for subjecting a surface of a substrate to alternate surface reactions of at least two precursors (A, B) according to principles of atomic layer deposition, the nozzle head comprising:

an output face via which gas is supplied towards the surface of the substrate and discharged from the surface of the substrate;

at least one gas supply nozzle arranged to supply gas towards the surface of the substrate; and at least one discharge nozzle arranged to discharge gas from the surface of the substrate via the output face, the nozzle head comprises on the output face in the following order: a first zone end nozzle, a gas supply nozzle and a second zone end nozzle, repeated one or more times on the output face, the first zone end nozzle is a discharge nozzle and is connected to a vacuum device for discharging gas from the surface of the substrate via the first zone end nozzle, the second zone end nozzle is a discharge nozzle and is connected to a vacuum device for discharging gas from the surface of the substrate via the second zone end nozzle, the gas supply nozzle is a precursor nozzle and is connected to a precursor source for supplying precursor to the surface of the substrate via the gas supply nozzle, the gas supply nozzle is provided between the first zone end nozzle and the second zone end nozzle, wherein a gas outlet of the first zone end nozzle, a gas outlet of the second zone end nozzle, a gas outlet of the gas supply nozzle, and the output face are all within a common plane, wherein the gas outlet of the first zone end nozzle is arranged at a first distance ($L_Y$) from the gas outlet of the gas supply nozzle, and the gas outlet of the second zone end nozzle is arranged at a second distance ($L_X$) from the gas outlet of the gas supply nozzle, and wherein the second distance ($L_X$) is at least 1.5 times greater than the first distance ($L_Y$).

2. The nozzle head according to claim 1, wherein the nozzle head comprises:

a precursor zone ($Z_A$, $Z_B$) provided between the first zone end nozzle and the second zone end nozzle such that the gas supply nozzle is a precursor nozzle arranged to supply precursor (A, B) towards the surface of the substrate; or a first precursor zone ($Z_A$) provided between the first zone end nozzle and the second zone end nozzle such that the gas supply nozzle is a first precursor nozzle arranged to supply a first precursor (A) towards the surface of the substrate, and a second precursor zone ($Z_B$) provided between the first zone end nozzle and the second zone end nozzle such that the gas supply nozzle is a second precursor nozzle arranged to supply a second precursor (B) towards the surface of the substrate.

3. The nozzle head according to claim 1, wherein the gas supply nozzle is arranged to supply precursor (A, B) towards the surface of the substrate via the output face.

4. The nozzle head according to claim 3, wherein:

the nozzle head comprises on the output face in the following order: a purge gas nozzle, a discharge nozzle, a gas supply nozzle and a discharge nozzle, repeated one or more times on the output face; or the nozzle head comprises on the output face in the following order: a purge gas nozzle, a discharge nozzle, a gas supply nozzle, a discharge nozzle and a purge gas nozzle, repeated one or more times on the output face; or the nozzle head comprises on the output face in the following order: a purge gas nozzle, a discharge nozzle, a gas supply nozzle, a discharge nozzle, a purge gas nozzle and a discharge nozzle, repeated one or more times on the output face.

5. The nozzle head according to claim 1, wherein:

the nozzle head comprises on the output face in the following order: a discharge nozzle, a purge gas nozzle, a gas supply nozzle and a discharge nozzle, repeated one or more times on the output face; or the nozzle head comprises on the output face in the following order: a discharge nozzle, a purge gas nozzle, a gas supply nozzle, a discharge nozzle and a purge gas nozzle, repeated one or more times on the output face; or the nozzle head comprises on the output face in the following order: a discharge nozzle, a purge gas nozzle, a gas supply nozzle, the discharge nozzle, a purge gas nozzle and a discharge nozzle, repeated one or more times on the output face;

the nozzle head comprises on the output face in the following order: a purge gas nozzle, discharge nozzle, gas supply nozzle, discharge nozzle, a purge gas nozzle and a discharge nozzle, repeated one or more times on the output face.

6. The nozzle head according to claim 1, wherein the output face comprises a first end and a second end, and that:

the first zone end nozzle, the gas supply nozzle and the second zone end nozzle are arranged on the output face between the first end and the second end; or the first zone end nozzle, the gas supply nozzle and the second zone end nozzle are longitudinal nozzles arranged on the output face adjacent to each other and arranged on the output face between the first end and the second end in the mentioned order;

the first zone end nozzle, the gas supply nozzle and the second zone end nozzle are longitudinal nozzles arranged on the output face adjacent to each other in a direction between the first end and the second end and arranged on the output face between the first end and the second end in the mentioned order.

7. The nozzle head according to claim 1, wherein the second distance ($L_X$) is at least 3 times the first distance ($L_Y$).

8. The nozzle head according to claim 1, wherein the first zone end nozzle defines a constant width between a gas inlet of the first zone end nozzle and a gas outlet of the first zone end nozzle, wherein the gas outlet of the first zone end nozzle is at the output face of the nozzle head, wherein the second zone end nozzle defines a constant width between a gas inlet of the second zone end nozzle and a gas outlet of the first zone end nozzle, wherein the gas outlet of the second zone end nozzle is at the output face of the nozzle head, wherein the gas supply nozzle defines a constant width between a gas inlet of the gas supply nozzle and a gas outlet of the gas supply nozzle, and wherein the gas outlet of the gas supply nozzle is at the output face of the nozzle head.

9. The nozzle head according to claim 1, wherein a gas inlet of the first zone end nozzle is arranged at the first distance ($L_Y$) from a gas inlet of the gas supply nozzle, and a gas inlet of the second zone end nozzle is arranged at the second distance ($L_X$) from the gas inlet of the gas supply nozzle.

10. The nozzle head according to claim 1, wherein the gas supply nozzle is directly adjacent the first zone end nozzle, and wherein the gas supply nozzle is directly adjacent the second zone end nozzle.

* * * * *